United States Patent
Garg et al.

(10) Patent No.: US 11,528,026 B2
(45) Date of Patent: Dec. 13, 2022

(54) MULTI-LEVEL TURN-OFF CIRCUIT AND RELATED METHODS

(71) Applicant: Texas Instruments Incorporated, Dallas, TX (US)

(72) Inventors: Mayank Garg, Murphy, TX (US); Shu-Ing Ju, Santa Clara, CA (US); Arun Rao, San Jose, CA (US); Wei Zhang, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/082,937

(22) Filed: Oct. 28, 2020

(65) Prior Publication Data

US 2021/0044294 A1 Feb. 11, 2021

Related U.S. Application Data

(63) Continuation of application No. 16/399,611, filed on Apr. 30, 2019, now Pat. No. 10,855,275.

(60) Provisional application No. 62/727,244, filed on Sep. 5, 2018.

(51) Int. Cl.
*H03K 17/687* (2006.01)
*H03K 17/693* (2006.01)

(52) U.S. Cl.
CPC ....... *H03K 17/6871* (2013.01); *H03K 17/693* (2013.01)

(58) Field of Classification Search
CPC ...... H02M 7/49; H02M 7/4837; H02M 7/487; H02M 7/4835; H02M 7/4833; H02M 7/483
See application file for complete search history.

(56) References Cited

U.S. PATENT DOCUMENTS

| 9,120,307 B2 * | 9/2015 | Abe .................... B41J 2/04541 |
| 2015/0180453 A1 * | 6/2015 | Mori .................... H02M 1/088 |
| | | 327/109 |
| 2016/0248243 A1 | 8/2016 | Yanagishima et al. |

* cited by examiner

*Primary Examiner* — Diana J. Cheng
(74) *Attorney, Agent, or Firm* — Ray A. King; Charles A. Brill; Frank D. Cimino

(57) ABSTRACT

Methods, apparatus, systems, and articles of manufacture are disclosed for a multi-level turn-off circuit. An example power delivery circuit includes a two-level turn-off circuit to be coupled to a first switch to reduce a first gate voltage of the first switch from a first voltage to a second voltage when a current flowing through the first switch is greater than an over-current threshold, the two-level turn-off circuit including a second switch, a voltage-current-voltage buffer to reduce a second gate voltage of the second switch from a third voltage to a fourth voltage, and a comparator circuit to turn off the second switch when the second gate voltage is the fourth voltage, and a driver to be coupled to the first switch to turn off the first switch when the second gate voltage is the fourth voltage.

20 Claims, 8 Drawing Sheets

MULTI-LEVEL TURN-OFF CIRCUIT AND RELATED METHODS

RELATED APPLICATION

This application is a continuation application of U.S. patent application Ser. No. 16/399,611, filed Apr. 30, 2019, which claims priority to U.S. Provisional Patent Application Ser. No. 62/727,244, which was filed on Sep. 5, 2018, which applications are hereby incorporated herein by reference in their entireties.

FIELD OF THE DISCLOSURE

This disclosure relates generally to gate drivers and, more particularly, to multi-level turn-off circuit and related methods.

BACKGROUND

High-voltage and/or high-current applications require power electronic devices capable of efficient and effective operation at elevated temperatures. In such applications, power modules deliver the required power using power metal-oxide-semiconductor field-effect transistors (MOSFETs). The power MOSFETs may be used as power delivering devices to support tens or hundreds of amperes during normal operation to deliver the power to a load.

Figure 1B:
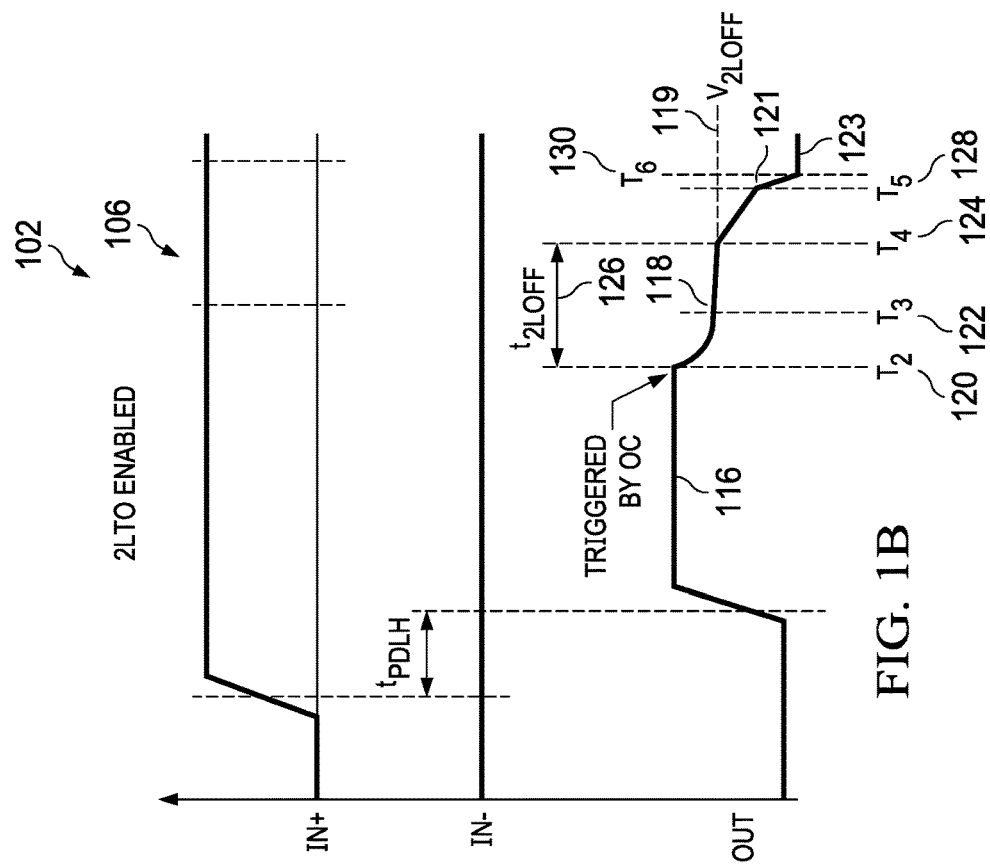
FIGS. 1A-1B depict schematic illustrations of example graphs corresponding to example output voltage profiles for an example power device when operating in an example normal operation mode and in an example two-level turn-off operation mode.

The figures are not to scale. In general, the same reference numbers will be used throughout the drawing(s) and accompanying written description to refer to the same or like parts. Connecting lines or connectors shown in the various figures presented are intended to represent example functional relationships and/or physical or logical couplings between the various elements.

Descriptors "first," "second," "third," etc. are used herein when identifying multiple elements or components which may be referred to separately. Unless otherwise specified or understood based on their context of use, such descriptors are not intended to impute any meaning of priority or ordering in time but merely as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

High-voltage and/or high-current isolated gate driver environments and applications, such as a traction inverter in an electric vehicle (EV), a hybrid-electric vehicle (HEV), etc., require power electronic devices capable of efficient and effective operation at elevated temperatures. Power delivery and/or management modules deliver the required power using low-impedance power metal-oxide-semiconductor field-effect transistors (MOSFETs) made from Silicon Carbide (SiC). The power SiC transistors may be used as power delivering devices to support tens or hundreds of amperes during normal operation to deliver the power to a load. Other power modules may adopt low impedance isolated gate bipolar transistor (IGBT) devices to provide the power delivery requirements for applications such as traction inverters for EVs, HEVs, etc.

In such high-power applications, current can build to hundreds of amperes when a short-circuit fault occurs. If a power device is not turned off in a controlled and timely manner, high voltage overshoot spikes are generated due to parasitic inductors and high-slew current flowing through the power device. The power device may become damaged from the high-slew current. Collaterally, devices included in and/or otherwise associated with the power module may become damaged due to the high voltage overshoot spikes.

Examples disclosed herein turn off a power device in a controlled and timely manner through multiple turn-off stages (e.g., two or more turn-off levels, steps, operations, etc.) when an over-current condition of the power device is detected. For example, the output stage circuit can include an output high (OUTH) driver and an output low (OUTL) driver that can generate an output by adjusting one or more current paths to charge or discharge a gate of the power device. In some disclosed examples, a power device, such as a power switch or a power transistor, is turned off in at least two steps when current flowing through the power device exceeds and/or otherwise meets an over-current threshold. First, the power device is put in a higher drain-to-source on resistance (RDS(on) or RDSON) state by lowering a gate voltage of the power device from a first voltage (e.g., a gate voltage to generate a threshold voltage ($V_{TH}$) of the power device, a supply voltage, etc.) to a second voltage (e.g., a two-level turn-off voltage). Second, the gate voltage is pulled down from the second voltage to a third voltage to turn off the power device. The third voltage may correspond to (1) a source voltage when the power device is a N-channel MOSFET or (2) an emitter voltage when the power device is an NPN bi-polar junction transistor (BJT). In some disclosed examples, the gate voltage may be further pulled down from the third voltage to a fourth voltage to ensure a complete turn off of the power device.

In some disclosed examples, the OUTL driver adjusts a current path to the gate of the power device to pull down the gate voltage from the second voltage to the third voltage. For example, a soft-turn off (STO) circuit can adjust the current path to pull down the gate voltage from the second voltage to the third voltage. In such disclosed examples, the STO circuit can discharge the gate voltage of the power device using a smaller current when compared to a current used by the OUTL driver to turn off the power device. In some disclosed examples, a clamp circuit adjusts a current path to the gate of the power device to pull down the gate voltage from the third voltage to a fourth voltage to ensure complete turn off of the power device.

In other examples, the power device may be put in a higher RDSON state by first increasing a gate voltage of the power device from a first voltage (e.g., a gate voltage to generate $V_{TH}$ of the power device) to a second voltage. Second, the gate voltage may be increased from the second voltage to a third voltage to turn off the power device. The third voltage may correspond to (1) a source voltage when the power device is a P-channel MOSFET or (2) an emitter voltage when the power device is a PNP BJT. In some disclosed examples, the gate voltage may be further increased from the third voltage to a fourth voltage to ensure a complete turn off of the power device. In such disclosed examples, the STO circuit and/or, more generally, the OUTL driver can turn off the power device by increasing the gate voltage from the second voltage to the third voltage. For example, STO circuit can discharge the gate voltage of the power device using a smaller current when compared to a current used by the OUTL driver to turn off the power device. The example clamp circuit can be used to turn off the power device by increasing the gate voltage from the third voltage to the fourth voltage.

Figure 1A:
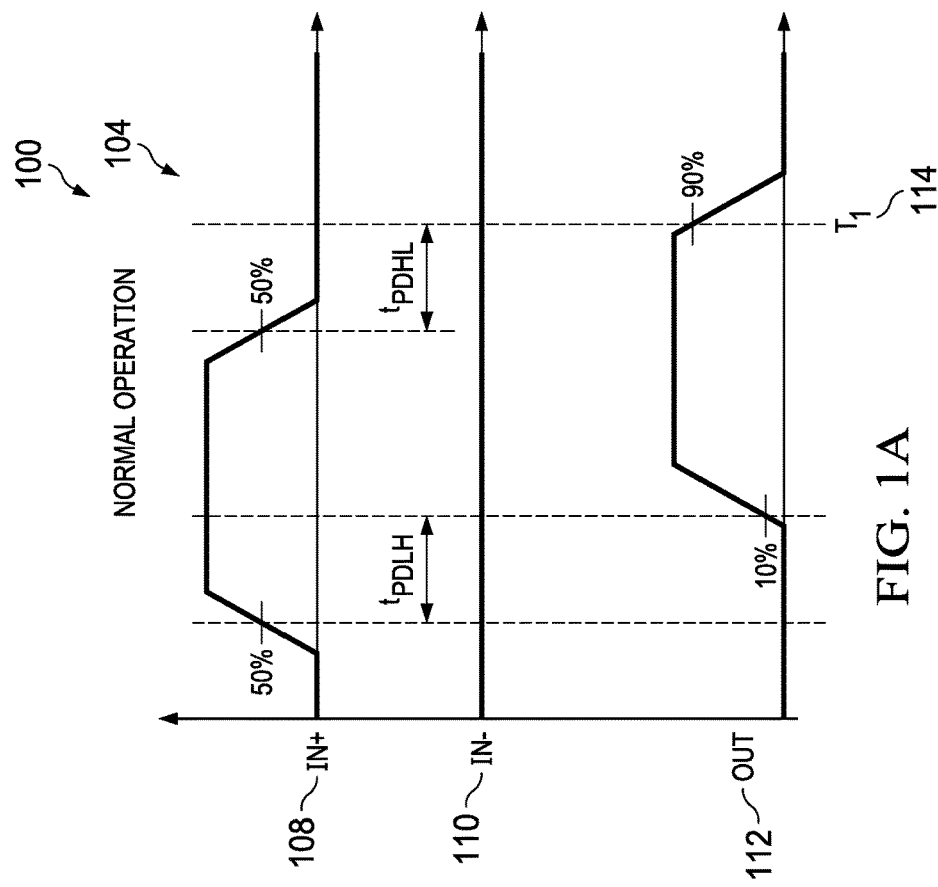

FIGS. 1A-1B depict schematic illustrations of example graphs 100, 102 corresponding to example output voltage profiles 104, 106 for an example power device (e.g., a power switching device, a power MOSFET, an IGBT, etc.). The power device can correspond to an example switch 206 depicted in FIG. 2. In FIG. 1A, a first example graph 100 depicts a first example output voltage profile 104 when the switch 206 is operating in an example normal operation mode. For example, the switch 206 can operate in the normal operation mode when a current flowing through the switch 206 does not meet an over-current threshold. In FIG. 1B, a second example graph 102 depicts a second example output voltage profile 106 when the switch 206 is operating in an example two-level turn-off (2LTO) operation mode. For example, the switch 206 can operate in the 2LTO operation mode when the current flowing through the switch 206 meets the over-current threshold.

Figure 2:
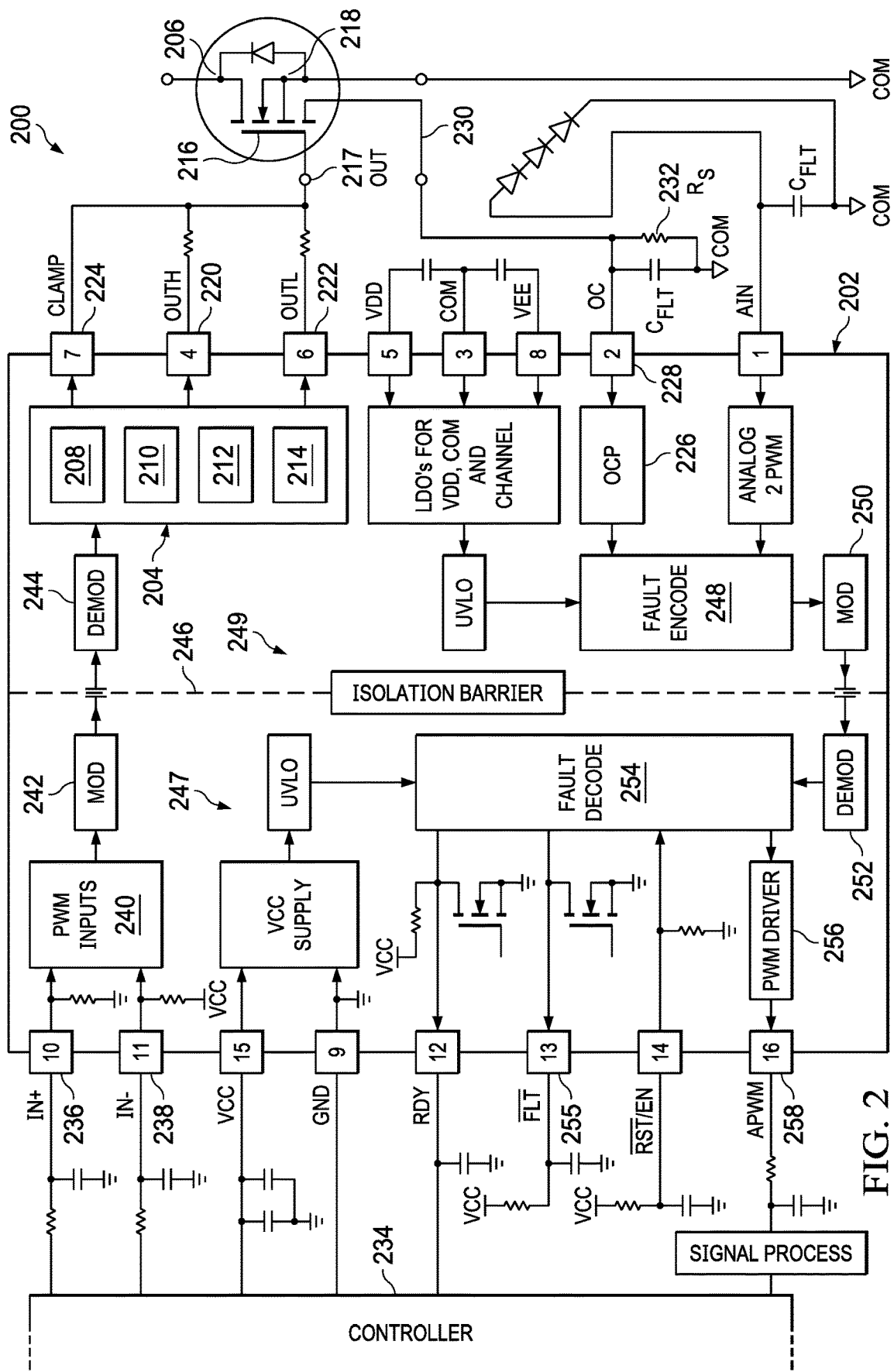
FIG. 2 is a schematic illustration of an example gate driver system including an example gate driver integrated device that includes an example output stage circuit to facilitate switch operations of an example switch.

In the first graph 100 of FIG. 1A, an example OUTH driver is enabled when an example positive input signal (IN+) 108 is asserted. The OUTH driver can correspond to an example OUTH driver 208 depicted in FIG. 2. The positive input signal 108 can correspond to a signal at a fifth example pin 236 depicted in FIG. 2. For example, the input signal 108 may correspond to an input pulse-width modulation (PWM) signal from a controller, such as an example controller 234 depicted in FIG. 2. Further depicted in the first graph 100 is an example negative input signal (IN−) 110 and an example output signal (OUT) 112. The negative input signal 110 can correspond to a signal at a sixth example pin 238 depicted in FIG. 2. For example, the negative input signal 110 can correspond to an input PWM signal. The output signal 112 can correspond to a voltage (e.g., an output voltage) at an output node for driving the switch 206. The output signal 112 can correspond to an output voltage at an example output node (OUT) 217 as depicted in FIG. 2. For example, the output signal 112 can correspond to a voltage generated by an adjustment of a current path by the OUTH driver 208, an example OUTL driver 210 as depicted in FIG. 2, etc.

In the first graph 100 of FIG. 1A, the switch 206 is not experiencing an over-current condition. Accordingly, at a first example time $(T_1)$ 114, the switch 206 is being turned off in a typical or non-over current condition manner. For example, after a time period corresponding to a propagation delay from transitioning from high (e.g., on) to low (e.g., off) $(t_{PDHL})$ has elapsed, the output signal 112 decreases in an approximate linear manner corresponding to the switch 206 being turned off and an output capacitor coupled to the switch 206 being discharged.

In the second graph 102 of FIG. 1B, the switch 206 is experiencing an over-current (OC) condition. For example, a quantity of current flowing through the switch 206 is exceeding a predefined threshold, such as an OC threshold. In some examples, the controller 234 of FIG. 2 obtains an indication of the OC condition based on a current measurement from a sense terminal (e.g., an example sense terminal 230 of FIG. 2) of the switch 206. In response to the OC threshold being met, the switch 206 is turned off in two or more stages. In the second graph 102 of FIG. 1B, an example multi-level turn-off circuit 212 as depicted in FIG. 2 triggers the turn off of the switch 206 in a first series of two stages followed by one or more additional stages to turn off (e.g., completely turn off) the switch 206.

In the second graph 102 of FIG. 1B, in response to the OC condition, during a first stage, the multi-level turn-off circuit 212 reduces the output signal 112 from a first example voltage 116 at a second example time $(T_2)$ 120 to a second example voltage 118 at a third example time $(T_3)$ 122. In some examples, the multi-level turn-off circuit 212 includes a capacitor (e.g., a Miller capacitor) to limit a slew rate of the reduction in voltage from the second time 120 until the third time 122. The second voltage 118 corresponds to an example two-level turn-off voltage $(V_{2LOFF})$ 119. The example multi-level turn-off circuit 212 maintains the output signal 112 at the second voltage 118 from the third time 122 until a fourth example time $(T_4)$ 124.

In the second graph 102 of FIG. 1B, the time duration starting from the second time 120 and ending at the fourth time 124 corresponds to an example two-level turn-off time period $(t_{2LOFF})$ 126. In FIG. 1B, the $t_{2LOFF}$ 126 is a pre-determined and/or otherwise pre-defined time period. In some examples, the $t_{2LOFF}$ 126 is approximately two microseconds. Alternatively, $t_{2LOFF}$ 126 may be any other quantity of time. In some examples, the time period from the third time 122 until the fourth time 124 is approximately 0.7 microseconds (us). Alternatively, the time period from the third time 122 until the fourth time 124 may be any other quantity of time.

In the second graph 102 of FIG. 1B, during a second stage, the multi-level turn-off circuit 212 reduces the output signal 112 from the second voltage 118 at the fourth time 124 to a third example voltage 121 at a fifth example time $(T_5)$ 128. In some examples, an example OUTL driver, such as the example OUTL driver 210 depicted in FIG. 2, turns off the switch 206 when a time duration corresponding to the third time 122 until the fourth time 124 has elapsed. In some examples, the OUTL driver 210 turns off the switch 206 when $t_{2LOFF}$ 126 has elapsed at the fourth time 124 by turning on a soft-turn off (STO) transistor. In some examples, the OUTL driver 210 turns off the switch 206 by turning on the STO transistor to adjust a current path of the gate of the switch 206. For example, the OUTL driver 210 can turn on the STO transistor from the fourth time 124 to the fifth time 128 to reduce the second voltage 118 to the third voltage 121.

In the second graph 102 of FIG. 1B, during a third stage, the multi-level turn-off circuit 212 reduces the output signal 112 from the third voltage 121 at the fifth time 128 to a fourth example voltage 123 at a sixth example time ($T_6$) 130. In some examples, an example clamp circuit, such as an example clamp circuit 214 depicted in FIG. 2, turns off the switch 206 by turning on a clamp transistor. In some examples, the clamp circuit 214 turns off the switch 206 by turning on the clamp transistor to adjust a current path of the gate of the switch 206. For example, the clamp circuit 214 can turn on the clamp transistor from the fifth time 128 to the sixth time 130 to reduce the third voltage 121 to the fourth voltage 123. In response to turning off the switch 206 at the sixth time 130, the OUTH driver 208 can turn on the switch 206 at or after the sixth time 130 and, thus, increase the output signal 112 to resume delivering power to a load coupled to the switch 206.

Advantageously, the multi-level turn-off circuit 212 facilitates a multi-level turn-off of the switch 206 with low-current consumption and a fast settling to a desired voltage level. Advantageously, the multi-level turn-off of the switch 206 mitigates surge current spikes during an ON-OFF transition of the switch 206 in power delivery applications, such as for EV and HEV traction inverters and power modules. Accordingly, the disclosed examples herein in connection with the multi-level turn-off of the switch 206 are directed to one or more improvements in the functioning of hardware associated with the practical application of power delivering devices included in and/or otherwise associated with EV and HEV.

FIG. 2 is a schematic illustration of an example gate driver system 200 including an example gate driver integrated device 202 that includes an example output stage circuit 204 to facilitate switch operations of the switch 206. The gate driver system 200 is a high-voltage (e.g., 800 Volt (V) rating) isolated gate driver system (e.g., a power delivery system) that can deliver power to a high-voltage and/or a high-current load. For example, the gate driver system 200 can be used to deliver power to an electric motor, a traction inverter, or any other type of electrical device included in an EV, an HEV, etc. Alternatively, the gate driver system 200 may be used to deliver power to any other electrical device or load. In FIG. 2, the gate driver integrated device 202 is implemented in an integrated circuit. The gate driver integrated device 202 of the illustrated example is a power delivery circuit. For example, the gate driver integrated device 202 is to be coupled to the switch 206 to control and/or otherwise facilitate switching operations of the switch 206. In such examples, the gate driver integrated device 202 can turn on the switch 206 to deliver power to a load. In other examples, the gate driver integrated device 202 can turn off the switch 206 in two or more stages to terminate power delivery to the load.

The output stage circuit 204 of FIG. 2 is implemented in hardware. Alternatively, the output stage circuit 204 may be implemented using hardware logic, machine readable instructions, hardware implemented state machines, etc., and/or a combination thereof. For example, the output stage circuit 204 can be a controller that stores and/or accesses machine readable instructions. In such examples, the output stage circuit 204 can execute machine readable instructions to turn off the switch 206 with two or more turn-off stages, steps, operations, etc.

In the illustrated example of FIG. 2, the output stage circuit 204 includes the drivers 208, 210 to turn (e.g., switch) on or off the switch 206. For example, the output stage circuit 204 can generate an output to adjust operation of the switch 206 by providing an adjustment to one or more current paths to charge or discharge an example gate (e.g., a current terminal, a gate terminal, etc.) 216 of the switch 206. The output stage circuit 204 includes a first driver, such as the OUTH driver 208, to turn on the switch 206 and a second driver, such as the OUTL driver 210, to turn off the switch 206. Alternatively, the output stage circuit 204 may include fewer or more drivers 208, 210 than depicted in FIG. 2. In FIG. 2, the output stage circuit 204 includes an example multi-level turn-off circuit 212 to provide a first level turn off function for turning off the switch 206 when a current flowing through the switch 206 exceeds an over-current threshold. In FIG. 2, the multi-level turn-off circuit 212 is a two-level turn-off (2LTO) circuit 212. For example, the 2LTO circuit 212 can reduce a gate voltage of the gate 216 from a first voltage to a second voltage (e.g., $V_{2LOFF}$ 119 of FIG. 1B). When the gate voltage reaches and/or otherwise becomes the second voltage, the 2LTO circuit 212 maintains the gate voltage at the second voltage for a time period corresponding to $t_{2LOFF}$ 126 of FIG. 1B (e.g., until $t_{2LOFF}$ 126 expires). In FIG. 2, the OUTL driver 210 provides a second level turn off function for turning off the switch 206 corresponding to the decrease in voltage depicted in the second graph 102 of FIG. 1B from the third time 122 until the fourth time 124. For example, the OUTL driver 210 can include a soft-turn off (STO) circuit to reduce the voltage depicted in the second graph 102 from the third time 122 until the fourth time 124.

In FIG. 2, the output stage circuit 204 includes the example clamp circuit 214 to provide a third level turn off function for turning off the switch 206 after the second level turn off function has been completed. For example, the clamp circuit 214 can turn off the switch 206 after the STO circuit of the OUTL driver 210 has reduced the voltage to a voltage threshold of the clamp circuit 214 (e.g., a clamp voltage threshold). In such examples, the clamp voltage threshold can correspond to the voltage at the fifth time 128 of FIG. 1B. In FIG. 2, the clamp circuit 214 is a Miller clamp circuit. For example, the clamp circuit 214 can short a path between the gate 216 and an example source (e.g., a current terminal, a source terminal, etc.) 218 of the switch 206 using a switching device (e.g., a BJT, a MOSFET, etc.) to turn off the switch 206. In such examples, after $t_{2LOFF}$ 126 of FIG. 1B has elapsed or passed, the clamp circuit 214 can reduce the gate voltage of the switch 206 below a source voltage level associated with the source terminal 218 of the switch 206. For example, a comparator included in the clamp circuit 214 can assert a logic High (e.g., a signal corresponding to a digital one) to turn on the switching device. When turned on, the switching device can provide a third level turn off function by turning off the switch 206. In some examples, the clamp circuit 214 is optional. In such examples, the OUTL driver 210 can be enabled to provide the third level turn off function instead of the clamp circuit 214. For example, the OUTL driver 210 can reduce the gate voltage of the gate 216 below the source voltage level after $t_{2LOFF}$ 126 has expired.

In the illustrated example of FIG. 2, the switch 206 is a SiC field-effect transistor (FET) (e.g., a SiC MOSFET). Alternatively, the switch 206 may be any other type of MOSFET made from any other material (e.g., Silicon). Alternatively, the switch 206 may be any other power switching device such as an IGBT. In FIG. 2, the gate 216 of the switch 206 is coupled to the output stage circuit 204 via one or more example pins or electrical connections of the gate driver integrated device 202. Alternatively, the gate 216 may be coupled to the gate driver integrated device 202 via one or more intervening connections, vias, nodes, etc. In some examples, the gate 216 is to be coupled to the gate driver integrated device 202 via the one or more pins. For example, the gate driver integrated device 202 can be a first integrated device and the switch 206 can be included in a second integrated device, where the first and second integrated devices are separately manufactured and can be integrated into a single module. In such examples, the gate driver integrated device 202 and the switch 206 are separate integrated devices and may not be packaged and/or otherwise assembled together prior to being received by an end user. For example, the end user may separately obtain the gate driver integrated device 202 and the switch 206 and arrange the gate driver integrated device 202 to the switch 206 as depicted in FIG. 2 after separately obtaining the devices.

In the illustrated example of FIG. 2, the gate 216 is coupled to a first example pin 220 at an example output node 217. The first pin 220 is pin 4 (OUTH) of the gate driver integrated device 202. The first pin 220 corresponds to a first path (e.g., a current path) or a first output (e.g., a high output, a high voltage output, etc.) of the OUTH driver 208. For example, the OUTH driver 208 can adjust the voltage at the output node 217 to turn on the switch 206 by pulling up the gate voltage of the gate 216 above a threshold voltage ($V_{TH}$). In such examples, the OUTH driver 208 can pull up the gate voltage of the gate 216 by adjusting a current path to the gate 216. For example, the OUTH driver 208 can turn on one or more transistors to adjust the current path of the gate 216 to a voltage rail, a reference voltage rail, etc., to charge the gate 216.

In FIG. 2, the gate 216 is coupled to a second example pin 222 at the output node 217. The second pin 222 is pin 6 (OUTL) of the gate driver integrated device 202. The second pin 222 corresponds to a second path (e.g., a current path) or a second output (e.g., a low output, a low voltage output, etc.) of at least one of the OUTL driver 210 or the 2LTO circuit 212. For example, the OUTL driver 210 can adjust the voltage at the output node 217 to turn off the switch 206 by pulling down the gate 216 below the threshold voltage. In such examples, the OUTL driver 210 can pull down the gate voltage of the gate 216 by adjusting a current path to the gate 216. For example, the OUTL driver 210 can turn on one or more transistors to adjust the current path of the gate 216 to a ground rail, a reference rail, etc., to discharge the gate 216. In other examples, when an over-current condition is detected, the 2LTO circuit 212 can reduce the gate voltage of the gate 216 to the second voltage (e.g., $V_{2LOFF}$ 119), where the second voltage is above the threshold voltage of the switch 206.

In FIG. 2, the gate 216 is coupled to a third example pin 224 at the output node 217. The third pin 224 is pin 7 (CLAMP) of the gate driver integrated device 202. The third pin 224 corresponds to a third path (e.g., a current path) or a third output (e.g., a clamp output, a turn-off voltage output, etc.) of the clamp circuit 214. For example, the clamp circuit 214 can adjust the voltage at the output node 217 by pulling down the gate voltage of the gate 216 by adjusting a current path to the gate 216. In such examples, the clamp circuit 214 can turn on one or more transistors to adjust the current path of the gate 216 to reduce the gate voltage of the gate 216 below the threshold voltage of the switch 206.

In the illustrated example of FIG. 2, the gate driver integrated device 202 detects an over-current condition associated with the switch 206 by measuring a current flowing through the switch 206. In FIG. 2, the gate driver integrated device 202 includes an example over-current protection (OCP) circuit 226 to detect the over-current condition. The OCP circuit 226 obtains a voltage corresponding to the current flowing through the switch 206 via a fourth example pin 228. The fourth pin 228 is pin 2 (OC) of the gate driver integrated device 202. The fourth pin 228 corresponds to an over-current measurement associated with the switch 206.

In the illustrated example of FIG. 2, an example sense terminal 230 of the switch 206 is coupled to the fourth pin 228. In operation, a current flowing through the sense terminal 230 generates a voltage across an example sense resistor 232. In FIG. 2, the sense resistor 232 is coupled to the fourth pin 228 and the sense terminal 230. The OCP circuit 226 obtains the voltage via the fourth pin 228 and compares the voltage to an over-current threshold. For example, the over-current threshold is a voltage that corresponds to a current above which corrective action is to be taken by the gate driver integrated device 202 to protect the switch 206. In such examples, the corrective action can correspond to triggering a multiple-level turn off operation via at least one of the OUTL driver 210, the 2LTO circuit 212, or the clamp circuit 214.

In the illustrated example of FIG. 2, the gate driver system 200 includes the controller 234 to control and/or otherwise manage switch operations of the switch 206 via the gate driver integrated device 202. Alternatively, the controller 234 may be included in the gate driver integrated device 202. In FIG. 2, the controller 234 is an integrated circuit. Alternatively, the controller 234 may be implemented using hardware logic, machine readable instructions, hardware implemented state machines, etc., and/or a combination thereof.

In the illustrated example of FIG. 2, the controller 234 generates example signals (e.g., current signals) that are converted to example input voltages. The input voltages include a first example input voltage (IN+) that is obtained by the gate driver integrated device 202 at a fifth example pin 236. The fifth pin 236 is pin 10 of the gate driver integrated device 202. The input voltages include a second example input voltage (IN−) that is obtained by the gate driver integrated device 202 at a sixth example pin 238. The sixth pin 238 is pin 11 of the gate driver integrated device 202. The input voltages are converted to PWM signals by an example PWM input circuit 240.

In the illustrated example of FIG. 2, the PWM input circuit 240 generates and transmits the PWM signals to a first example modulator (MOD) circuit 242 that modulates the PWM signals. The first MOD circuit 242 transmits the modulated PWM signals to a first example demodulator (DEMOD) circuit 244 that demodulates the PWM signals. The first MOD circuit 242 transmits the modulated PWM signals to the first DEMOD circuit 244 through an example isolation barrier 246. The isolation barrier 246 ensures that the electrical grounds between a first example die 247 and a second example die 249 of the gate driver integrated circuit 202 are separated. In FIG. 2, the isolation barrier 246 is a capacitive isolation barrier. Alternatively, the isolation barrier 246 may be implemented as an inductive isolation barrier, an optocoupled isolation barrier, or any other suitable isolation barrier.

In the illustrated example of FIG. 2, the first DEMOD circuit 244 transmits the demodulated PWM signals to the output stage circuit 204. The output stage circuit 204 processes the demodulated PWM signals from the first DEMOD circuit 244 to facilitate operation of at least one of the OUTH driver 208, the OUTL driver 210, the 2LTO circuit 212, or the clamp circuit 214. For example, the controller 234 can generate one or more control signals to operate at least one of the OUTL driver 208, the OUTL driver 210, the 2LTO circuit 212, or the clamp circuit 214.

In the illustrated example of FIG. 2, the controller 234 obtains a signal (e.g., a fault signal, an over-current indicator, etc.) from the OCP circuit 226 when an over-current condition is detected. In FIG. 2, in response to detecting the over-current condition associated with the switch 206, the OCP circuit 226 asserts a logic High to an example fault encode circuit 248. Alternatively, the OCP circuit 226 may generate a logic Low (e.g., a signal corresponding to a digital zero) to the fault encode circuit 248 when the over-current condition is detected. The fault encode circuit 248 generates and transmits a fault signal to a second example modulator (MOD) circuit 250. In some examples, the fault signal from the fault encode circuit 248 corresponds to an indication that the over-current condition is detected. In some examples, the fault signal from the fault encode circuit 248 corresponds to a measurement (e.g., a voltage, a current, etc., obtained by the fourth pin 228) associated with the over-current condition.

In the illustrated example of FIG. 2, the second MOD circuit 250 modulates the fault signal from the fault encode circuit 248 and transmits the modulated fault signal to a second example demodulator (DEMOD) circuit 252 through the isolation barrier 246. The second DEMOD circuit 252 demodulates the modulated fault signal from the second MOD circuit 250 and transmits the demodulated fault signal to an example fault decode circuit 254. The fault decode circuit 254 decodes the fault signal to determine that an over-current condition has been detected. In response to determining the over-current condition associated with the switch 206, the fault decode circuit 254 generates and transmits a fault (FLT) signal (e.g., an alarm, an alert, a fault indicator, etc.) to a seventh example pin 255. The seventh pin 255 is pin 13 of the gate driver integrated device 202 and corresponds to a fault (FLT) indicator pin. An example PWM driver circuit 256 becomes idle during a time period in which the fault decode circuit 254 asserts the FLT signal. After the FLT signal is asserted, the PWM driver circuit 256 resumes generating PWM signals. The PWM driver circuit 256 transmits the PWM signals to the controller 234 via an eighth example pin 258. The eighth pin 258 is pin 16 of the gate driver integrated device 202. In response to an assertion of the alert signal indicated by a voltage measured at the seventh pin 255, the controller 234 determines that the over-current condition has been detected. In some examples, in response to the determination, the controller 234 generates and transmits signals to the PWM input circuit 240 to operate at least one of the OUTH driver 208, the OUTL driver 210, the 2LTO circuit 212, or the clamp circuit 214.

In the illustrated example of FIG. 2, the gate driver integrated device 202 includes two dies 247, 249. In FIG. 2, the dies 247, 249 are silicon dies. Alternatively, the gate driver integrated device 202 may include fewer or more dies 247, 249 than depicted in FIG. 2. In FIG. 2, the dies 247, 249 include a first die (e.g., a first silicon die) 247 on a first side of the isolation barrier 246 and a second die (e.g., a second silicon die) 249 on a second side of the isolation barrier 246. In FIG. 2, the first die 247 includes the PWM input circuit 240, the first MOD circuit 242, the second DEMOD circuit 252, the fault decode circuit 254, and the PWM driver circuit 256. In FIG. 2, the second die 249 includes the output stage circuit 204, the OCP circuit 226, the first DEMOD circuit 244, the fault encode circuit 248, and the second MOD circuit 250. Alternatively, one or more of the output stage circuit 204, the OCP circuit 226, the PWM input circuit 240, the first MOD circuit 242, the first DEMOD circuit 244, the fault encode circuit 248, the second MOD circuit 250, the second DEMOD circuit 252, the fault decode circuit 254, and/or the PWM driver circuit 256 may be implemented on a plurality of dies (e.g., silicon dies) within the gate driver integrated device 202. Alternatively, one or more of the output stage circuit 204, the OCP circuit 226, the PWM input circuit 240, the first MOD circuit 242, the first DEMOD circuit 244, the fault encode circuit 248, the second MOD circuit 250, the second DEMOD circuit 252, the fault decode circuit 254, and/or the PWM driver circuit 256 may be implemented on a plurality of integrated circuits.

Figure 3:
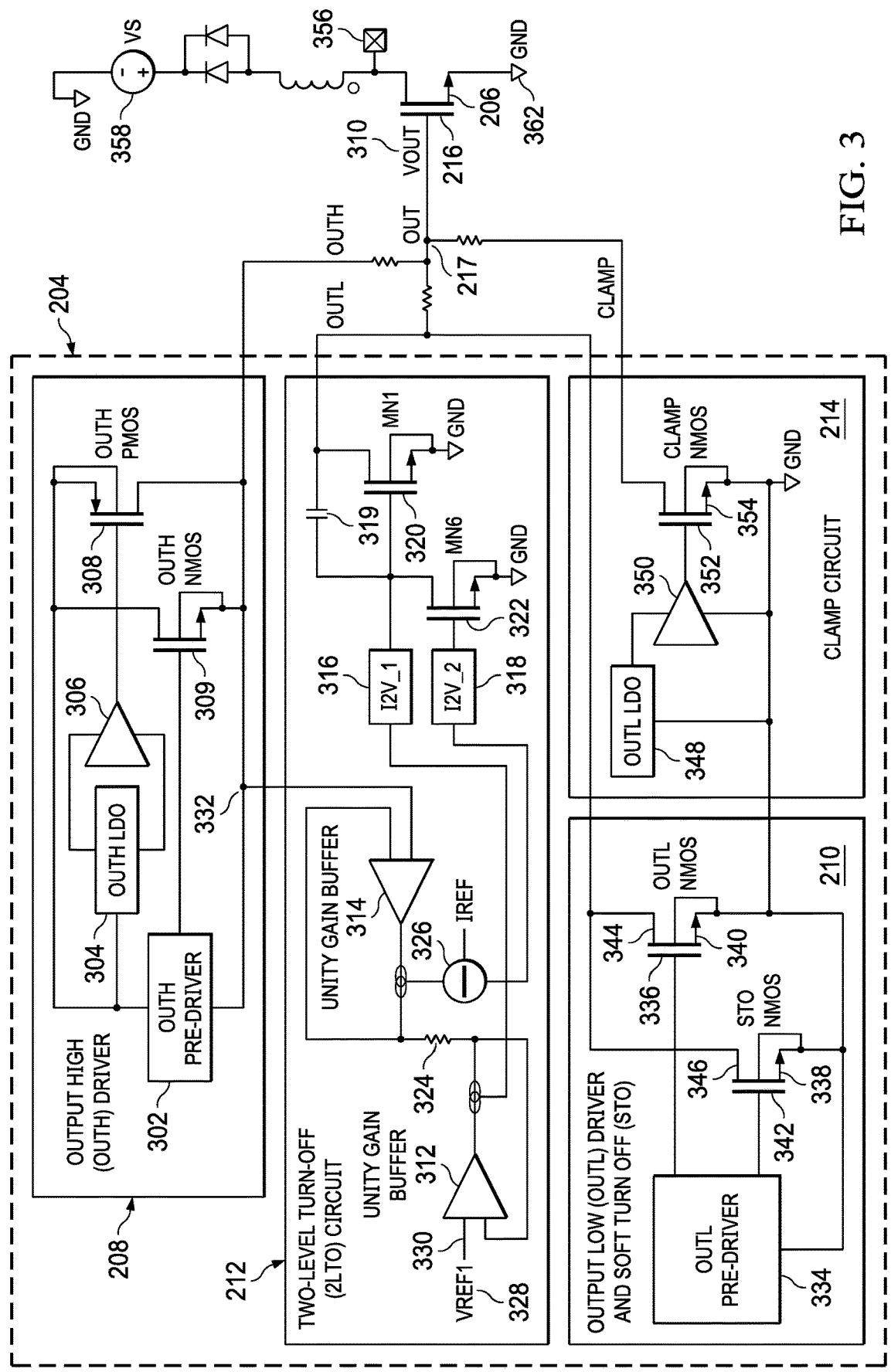
FIG. 3 is a schematic illustration of the example output stage circuit of FIG. 2 including the example output high driver of FIG. 2, the example output low driver of FIG. 2, the example two-level turn-off circuit of FIG. 2, and the example clamp circuit of FIG. 2 to facilitate switch operations of the example switch of FIG. 2.

FIG. 3 is a schematic illustration of the output stage circuit 204 of FIG. 2 including the OUTH driver 208, the OUTL driver 210, the 2LTO circuit 212, and the clamp circuit 214 of FIG. 2 to turn on and off the switch 206 of FIG. 2. In FIG. 3, the OUTH driver 208 includes an example OUTH pre-driver circuit 302, an example OUTH low-dropout (LDO) regulator 304, a first example buffer 306 (e.g., a CMOS buffer), an example OUTH P-channel MOSFET 308, and an example OUTH N-channel MOSFET 309. The OUTH driver 208 includes the OUTH pre-driver circuit 302 to provide an integrated charge pump, gate drive, and protection for the OUTH P-channel MOSFET (OUTH PMOS) 308 and the OUTH N-channel MOSFET (OUTH NMOS) 309. For example, the OUTH pre-driver circuit 302 can provide a continuous gate drive for at least one of the OUTH P-channel MOSFET 308 and the OUTH N-channel MOSFET 309. In FIG. 3, the OUTH pre-driver circuit 302 turns on at least one of the OUTH P-channel MOSFET 308 or the OUTH N-channel MOSFET 309 to generate an example voltage VOUT 310. In FIG. 3, the voltage VOUT 310 corresponds to the voltage at the output node 217 of FIG. 2.

In FIG. 3, the OUTH driver 208 includes the OUTH LDO regulator 304 to regulate the output voltage to the OUTH P-channel MOSFET 308 and the OUTH N-channel MOSFET 309. In FIG. 3, the OUTH LDO regulator 304 is a 5 V LDO regulator. Alternatively, the OUTH LDO regulator 304 may regulate the output voltage to any other voltage. In FIG. 3, the OUTH driver 208 generates the signal OUTH that adjusts VOUT 310 of the gate 216 via the first pin 220 of FIG. 2. For example, the OUTH driver 208 can adjust a current path to the gate 216 to increase VOUT 310 by turning on at least one of the OUTH P-channel MOSFET 308 or the OUTH N-channel MOSFET 309.

In the illustrated example of FIG. 3, the 2LTO circuit 212 includes a second example buffer 312, a third example buffer 314, a first example current-to-voltage buffer (I2V_1) 316, an example comparator circuit (I2V_2) 318, a Miller capacitor 319, a first example N-channel MOSFET (MN1) 320, and a sixth example N-channel MOSFET (MN6) 322. In FIG. 3, the first current-to-voltage buffer 316 is associated with a low-frequency loop. The low-frequency loop corresponds to an electrical path of VOUT 310, an example sense node 332, an example resistor 324, the first current-to-voltage buffer 316, MN1 320 and back to VOUT 310.

As used herein, an N-channel MOSFET and/or a P-channel MOSFET can be referred to as a switch or a transistor. In FIG. 3, MN6 322 is depicted as being included in the comparator circuit 318. Alternatively, MN6 322 may not be included in the comparator circuit 318 as depicted in FIG. 3. In FIG. 3, the second buffer 312 and the third buffer 314 are unity gain buffers. Alternatively, one or both of the second buffer 312 and the third buffer 314 may be different types of buffers. In FIG. 3, the second and third buffers 312, 314 drive the resistor 324 to control a pull-down current and a reference current of the 2LTO circuit 212. For example, the pull-down current through the resistor 324 can correspond to an example current I2 408 described below in connection with FIG. 4. The resistor 324 can correspond to a voltage-to-current generator. In other examples, the reference current can correspond to an example current IREF 326 described below in connection with FIG. 4. The pull-down current is proportional to a voltage difference of a first example voltage (VREF1) 328 at an example reference voltage rail 330 and a second voltage at an example sense node 332 (e.g., OUTH, VOUT 310, etc.).

Figure 4:
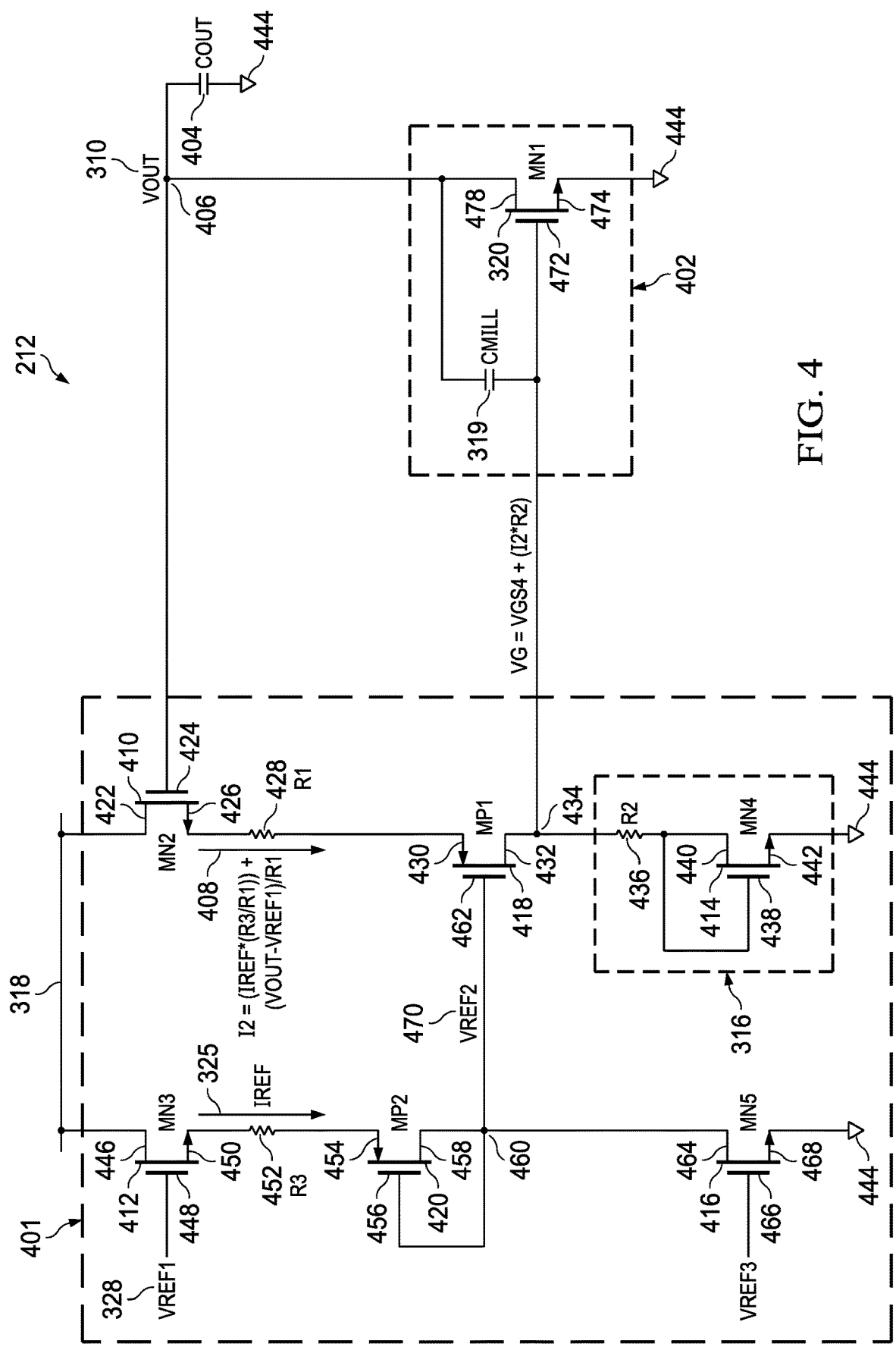
FIG. 4 is a schematic illustration of a portion of the example two-level turn-off circuit of FIG. 2 including an example voltage-current-voltage buffer to implement the examples disclosed herein.

In the illustrated example of FIG. 3, the reference voltage rail 330 is an input to the second buffer 312 and the sense node 332 is an input to the third buffer 314. In FIG. 3, an output of the second buffer 312 is coupled to the current-to-voltage buffer 316 at an example source (e.g., a current terminal, a source terminal, etc.) 430 of MP1 418 as depicted in FIG. 4. In FIG. 3, the current-to-voltage buffer 316 corresponds to a first current-to-voltage circuit (I2V_1). In FIG. 3, an output of the third buffer 314 is coupled to an example drain (e.g., a current terminal, a drain terminal, etc.) 422 of MN2 410 as depicted in FIG. 4. In FIG. 3, the 2LTO circuit 212 generates the signal OUTL that adjusts VOUT 310 of the gate 216 via the second pin 222 of FIG. 2. For example, the 2LTO circuit 212 can adjust a current path to the gate 216 to decrease VOUT 310 by turning on at least one of MN1 320 or MN6 322.

In the illustrated example of FIG. 3, the OUTL driver 210 includes an example OUTL pre-driver circuit 334, an example OUTL N-channel MOSFET (OUTL NMOS) 336, and an example soft-turn off (STO) N-channel MOSFET (STO NMOS) 338. The OUTL driver 210 includes the OUTL pre-driver circuit 334 to provide an integrated charge pump, gate drive, and protection for the OUTL N-channel MOSFET 336 and the STO N-channel MOSFET 338. In FIG. 3, the OUTL pre-driver circuit 334 is coupled to an example gate 340 of the OUTL N-channel MOSFET 336 and an example gate 342 of the STO N-channel MOSFET 338. In FIG. 3, an example drain 344 of the OUTL N-channel MOSFET 336 is coupled to an example drain 346 of the STO N-channel MOSFET 338. The OUTL pre-driver circuit 334 turns on the OUTL N-channel MOSFET 336 to generate a logic Low for VOUT 310, etc. In FIG. 3, the OUTL driver 210 generates the signal OUTL that adjusts VOUT 310 of the gate 216 via the second pin 222 of FIG. 2. For example, the OUTL driver 210 can adjust a current path to the gate 216 to decrease VOUT 310 by turning on at least one of the OUTL N-channel MOSFET 336 or the STO N-channel MOSFET 338.

In the illustrated example of FIG. 3, the clamp circuit 214 includes an example OUTL LDO regulator 348 to regulate the output voltage to a fourth example buffer 350 (e.g., a CMOS buffer). In FIG. 3, the OUTL LDO regulator 348 is a 5 V LDO regulator. Alternatively, the OUTL LDO regulator 348 may regulate the output voltage to any other voltage. In FIG. 3, an output of the fourth buffer 350 is coupled to an example gate 352 of an example clamp N-channel MOSFET 354. In some examples, the OUTL LDO regulator 348 turns on the clamp N-channel MOSFET 354 to generate a logic Low for the signal CLAMP, VOUT 310, etc. In FIG. 3, the clamp circuit 214 generates the signal CLAMP that adjusts VOUT 310 of the gate 216 via the third pin 224 of FIG. 2. For example, the clamp circuit 214 can adjust a current path to the gate 216 to decrease VOUT 310 by turning on the clamp N-channel MOSFET 354.

In normal operation (e.g., when an over-current condition is not present in association with the switch 206), the OUTH driver 208 turns on at least one of the OUTH P-channel MOSFET 308 or the OUTH N-channel MOSFET 309 to generate a signal (OUTH) to pull up VOUT 310 to turn on the switch 206. By turning on the switch 206, the OUTH driver 208 causes the switch 206 to deliver power to an example load 356 from an example voltage source (VS) 358. For example, the load 356 can be an electric motor, a traction inverter, or any other type of electrical device included in an EV, an HEV, etc. Alternatively, the load 356 may be a battery, a power converter such as a half-bridge power converter (e.g., a boost converter, a buck converter, a buck-boost converter, etc.), etc. In FIG. 3, the voltage source 358 is a battery. Alternatively, the voltage source 358 may be a capacitor, a direct current (DC) voltage source, etc. In FIG. 3, the switch 206 delivers power to the load 356. For example, the switch 206 can deliver a voltage in a range of 400-1200 V, a current in a range of 100-1000 Amperes (A), etc., and/or a combination thereof to the load 356.

In normal operation, the OUTL driver 210 turns on the OUTL N-channel MOSFET 336 to generate a signal (OUTL) to pull down VOUT 310 to begin turning off the switch 206. By turning off the switch 206, the OUTL driver 210 causes the switch 206 to disconnect power from the voltage source 358 to the load 356. In normal operation, when VOUT 310 is a pre-defined voltage above an example ground (GND) rail 362, the clamp circuit 214 turns on the clamp N-channel MOSFET 354 to increase the pull-down strength to hold VOUT 310 at the pre-defined voltage. For example, after the OUTH driver 208 turns off the OUTH P-channel MOSFET 308 and the OUTH N-channel MOSFET 309, the OUTL driver 210 turns on the OUTL N-channel MOSFET 336 to reduce VOUT 310. When VOUT 310 is 2 V above the ground rail 362, for example, the OUTL LDO regulator 348 turns on the clamp N-channel MOSFET 354 to increase the pull-down strength to reduce VOUT 310 further (e.g., below the pre-defined voltage). In some examples, the clamp circuit 214 is not included in the output stage circuit 204 and, thus, does not turn on when VOUT 310 is the pre-defined threshold above the ground rail 362. In other examples, the clamp circuit 214 is included in the output stage circuit but is disabled and, thus, does not turn on when VOUT 310 is the pre-defined threshold above the ground rail 362.

When an over-current condition is detected (e.g., when VOUT 310 at the sense node 332 is greater than VREF1 328 at the reference voltage rail 330), the 2LTO circuit 212 provides a first level turn-off function for the switch 206. For example, when VOUT 310 is greater than VREF1 328, the 2LTO circuit 212 can reduce VOUT 310 to $V_{2LOFF}$ 119 of FIG. 1B for a time period corresponding to $t_{2LOFF}$ 126 of FIG. 1B. When $t_{2LOFF}$ 126 has elapsed, the OUTL pre-driver circuit 334 turns on the STO N-channel MOSFET 338. The enabling of the STO N-channel MOSFET 338 corresponds to triggering a weak pulldown and performing the second level turn-off function in combination with either the OUTL N-channel MOSFET 336 or the clamp circuit 214. In some examples, the OUTL pre-driver circuit 334 turns on the STO N-channel MOSFET 338 at $T_4$ 124 of FIG. 1B. For example, the OUTL pre-driver circuit 334 can turn on the STO N-channel MOSFET 338 when 0.7 us have passed after VOUT 310 has reached $V_{2LOFF}$ 119. In other examples, the OUTL pre-driver circuit 334 can turn on the STO N-channel MOSFET 338 when 2.0 us have passed when VOUT 310 begins to decrease (e.g., at $T_2$ 120 of FIG. 1B).

In some examples, after the STO N-channel MOSFET 338 turns on and when VOUT 310 reaches a pre-defined voltage (e.g., a Miller voltage associated with the clamp circuit 214), the OUTL driver 210 performs the third level turn-off function by turning on the OUTL N-channel MOSFET 336 to turn off the switch 206 (e.g., discharging the gate voltage of the switch 206 all the way to a final turn-off voltage). In other examples, after the STO N-channel MOSFET 338 turns on and when VOUT 310 reaches a pre-defined voltage (e.g., the Miller voltage associated with the clamp circuit 214), the fourth buffer 350 performs the third level turn-off function by turning on the clamp N-channel MOSFET 354 to turn off the switch 206. Advantageously, by turning off the switch 206 in two or more levels or stages, the output stage circuit 204 reduces stress (e.g., over-stress) on the switch 206 when turning off the switch 206 compared to implementations not including the 2LTO circuit 212.

While an example manner of implementing the output stage circuit 204 of FIG. 2 is illustrated in FIGS. 2-3, one or more of the elements, processes, and/or devices illustrated in FIGS. 2-3 may be combined, divided, re-arranged, omitted, eliminated, and/or implemented in any other way. Further, the example OUTH driver 208, the example OUTL driver 210, the example 2LTO circuit 212, the example clamp circuit 214, and/or, more generally, the example output stage circuit 204 of FIGS. 2-3 may be implemented by hardware, software, firmware, and/or any combination of hardware, software, and/or firmware. Thus, for example, any of the example OUTH driver 208, the example OUTL driver 210, the example 2LTO circuit 212, the example clamp circuit 214, and/or, more generally, the example output stage circuit 204 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)). When reading any of the apparatus or system claims of this patent to cover a purely software and/or firmware implementation, at least one of the example OUTH driver 208, the example OUTL driver 210, the example 2LTO circuit 212, and/or the example clamp circuit 214 is/are hereby expressly defined to include a non-transitory computer readable storage device or storage disk such as non-volatile memory (e.g., read-only memory (ROM), electrically erasable programmable read-only memory (EEPROM), flash memory, etc.), volatile memory (e.g., Synchronous Dynamic Random Access Memory (SDRAM), Dynamic Random Access Memory (DRAM), etc., and/or any other type of random access memory (RAM) device), etc., including the software and/or firmware. Further still, the example output stage circuit 204 of FIG. 2 may include one or more elements, processes, and/or devices in addition to, or instead of, those illustrated in FIGS. 2-3, and/or may include more than one of any or all of the illustrated elements, processes, and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

FIG. 4 is a schematic illustration of a portion of the 2LTO circuit 212 of FIGS. 2-3. In FIG. 4, the 2LTO circuit 212 includes the current-to-voltage buffer 316 and MN1 320 of FIG. 3. Although not depicted in FIG. 4, the 2LTO circuit 212 includes the unity gain buffers 312, 314, the comparator circuit 318, the resistor 324, and MN6 322. The 2LTO circuit 212 includes an example high-frequency loop circuit 402. Further depicted in FIG. 4 is an example external parasitic capacitance 404 represented by a capacitor (COUT). Although the external parasitic capacitance 404 is depicted as a physical capacitor, the external parasitic capacitance 404 is not a physical capacitor but a representation of parasitic capacitance associated with the gate driver integrated device 202 of FIG. 2. For example, external parasitic capacitance 404 can correspond to a capacitance of 2 nanofarads (nF), 20 nF, 200 nF, etc. Alternatively, the external parasitic capacitance 404 may correspond to a different capacitance. The 2LTO circuit 212 includes an example voltage-current-voltage buffer 401. In FIG. 4, the voltage-current-voltage buffer 401 is an open-loop diff to single ended voltage-to-current-to-voltage (IV) stage circuit (e.g., a current-to-voltage buffer) that reduces VOUT 310 at an example 2LTO circuit output node 406. For example, the voltage-current-voltage buffer 401 can correspond to a voltage-current-voltage circuit, a voltage-current-voltage buffer circuit, etc. The voltage at the 2LTO circuit output node 406 can correspond to the voltage at the second pin 222 of FIG. 2. For example, VOUT 310 can correspond to the voltage at the second pin 222 that corresponds to the voltage at the gate 216 of the switch 206 of FIG. 2.

In the illustrated example of FIG. 4, the 2LTO circuit 212 includes the voltage-current-voltage buffer 401 to reduce and/or otherwise control a value of VOUT 310 when an over-current condition associated with the switch 206 of FIG. 2 is detected. The voltage-current-voltage buffer 401 can reduce the value of VOUT 310 until a desired threshold voltage is reached. For example, the voltage-current-voltage buffer 401 can cause the pull-down current (I2) 408 to flow through the voltage-current-voltage buffer 401. At the beginning of a discharge phase of VOUT 310, the voltage-current-voltage buffer 401 can cause I2 408 to have a first quantity of current to reduce VOUT 310 to a first voltage and, as VOUT 310 approaches the desired threshold voltage, can cause I2 408 to have a second quantity less than the first quantity.

In the illustrated example of FIG. 4, the voltage-current-voltage buffer 401 includes a second example N-channel MOSFET (MN2) 410, a third example N-channel MOSFET (MN3) 412, a fourth example N-channel MOSFET (MN4) 414, a fifth example N-channel MOSFET (MN5) 416, a first example P-channel MOSFET (MP1) 418, and a second example P-channel MOSFET (MP2) 420. In FIG. 4, the comparator circuit 318 of FIG. 3 is coupled to the drain 422 of MN2 410. The comparator circuit 318 is described in further detail in connection with FIG. 5. An example gate 424 of MN2 410 is coupled to MN1 320 at the 2LTO circuit output node 406. An example source 426 of MN2 410 is coupled to a first end of a first example resistor 428 having a resistance R1. For example, R1 can be 100 kiloohms. Alternatively, R1 may be any other value.

In the illustrated example of FIG. 4, a second end of the first resistor 428 is coupled to the source 430 of MP1 418. An example drain 432 of MP1 418 is coupled at an example gate node 434 to a first end of a second example resistor 436 having a resistance R2. A second end of the second resistor 436 is coupled to an example gate 438 and an example drain 440 of MN4 414. An example source 442 of MN4 414 is coupled to an example reference rail 444. For example, the reference rail 444 can be a ground rail, a negative voltage rail, etc. In FIG. 4, the current-to-voltage buffer 316 includes MN4 414 and the second resistor 436.

In the illustrated example of FIG. 4, an example drain 446 of MN3 412 is coupled to the comparator circuit 318. An example gate 448 of MN3 412 is coupled to the reference voltage rail 330 corresponding to VREF1 328. VREF1 328 can correspond to $V_{2LOFF}$ 119 of FIG. 1B. An example source 450 of MN3 412 is coupled to a first end of a third example resistor 452 having a resistance R3. Alternatively, one or more of the first, second, and/or third resistors 428, 436, 452 may have a different resistance. A second end of the third resistor 452 is coupled to an example source 454 of MP2 420. An example gate 456 of MP2 420 is coupled to an example drain 458 of MP2 420 at an example node 460. The gate 456 and drain 458 of MP2 420 are coupled to an example gate 462 of MP1 418 at the node 460. An example drain 464 of MN5 416 is coupled to the gate 456 of MP2 420 and the drain 458 of MP2 420 at the node 460. An example gate 466 of MN5 416 is coupled to a reference voltage rail having a voltage VREF3. An example source 468 of MN5 416 is coupled to the reference rail 444.

In the illustrated example of FIG. 4, the voltage-current-voltage buffer 401 is coupled to the high-frequency loop circuit 402 at the gate node 434. The gate node 434 has a voltage VG that corresponds to a sum of (1) a gate-to-source voltage of MN4 414 designated as VGS4 and (2) a ratio of the difference of VOUT 310 and an example voltage VREF2 470. VG is the gate voltage of an example gate 472 of MN1 320. An example source 474 of MN1 320 is coupled to the reference rail 444.

In the illustrated example of FIG. 4, the 2LTO circuit 212 includes the high-frequency loop circuit 402 to reduce and/or otherwise control a slew rate of VOUT 310. In FIG. 4, the high-frequency loop circuit 402 includes the Miller capacitor (CMILL) 319 of FIG. 3 to reduce VG during a fast transient and correspondingly slow down the slew rate associated with reducing VOUT 310 at the 2LTO circuit output node 406. In FIG. 4, the Miller capacitor 319 is coupled to the gate 472 of MN1 320 and an example drain 478 of MN1 320. In some examples, at low frequencies (e.g., a frequency in a range of 1 Hz to 10 megahertz (MHz)), the Miller capacitor 319 allows current to flow unaffected and/or otherwise unencumbered through the Miller capacitor 319. In some examples, at high frequencies (e.g., a frequency in a range of 10 MHz to 1 gigahertz (GHz)), the Miller capacitor 319 causes a reduction in current to flow through the Miller capacitor 319 and, thus, can cause a reduction in VG to a threshold voltage (e.g., a Miller voltage).

In the illustrated example of FIG. 4, MN3 412 and MN5 416 are on because VREF1 328 is above the turn-on voltages of MN3 412 and MN5 416. For example, VREF1 328 can be 11 V and MN3 412 and MN5 416 can have a turn-on voltage in a range of 8-10 V. In other examples, VREF1 328 can be any other voltage and/or the turn-on voltages of MN3 412 and MN5 416 can be a voltage in any other voltage range. In FIG. 4, MP2 420 is always on because the gate 456 of MP2 420 is shorted to the drain 458 of MP2 420. As a result, IREF 326 flows through MN3 412, MP2 420, and MN5 416 and, thus, causes the gate 462 of MP1 418 to have a voltage of VREF2 470. For example, IREF 326 can have a value of 10 micro-Amperes (uA), 15, uA, 20 uA, etc., or any other value. In FIG. 4, VREF2 470 is less than VREF1 328. For example, VREF2 470 can have a voltage corresponding to VREF2=VREF1−(IREF*R3)−$VGS_{MN3}$−$VSG_{MP2}$, where $VGS_{MN3}$ is the gate-to-source voltage of MN3 412 and $VSG_2$ is the source-to-gate voltage of MP2 420.

In operation, when VOUT 310 is above $V_{2LOFF}$ 119 of FIG. 1B, MN2 410 is on because VOUT 310 is above the turn-on voltage of MN2 410. For example, MN2 410 can have a turn-on voltage in a range of 15-18 V and VOUT 310 can be 15 V or higher (e.g., 15 V, 20 V, 25 V, etc.). When MN2 410 is on, I2 408 flows through MN2 410 and causes a voltage at the source 430 of MP1 418 to be greater than VREF2 470 at the gate 462 of MP1 418. As a result, the gate-to-source voltage of MP1 418 is negative and causes MP1 418 to turn on. When MP1 418 is on, MN4 414 is on because the gate-to-source voltage of MN4 414 is positive and above the threshold voltage of MN4 414. When MP1 418 is on, MN1 320 is on to discharge and/or otherwise reduce VOUT 310 to $V_{2LOFF}$ 119. For example, the external parasitic capacitance 404 can be discharged to the reference rail 444 through MN1 320 when MN1 320 is on.

In the illustrated example of FIG. 4, I2 408 has a value corresponding to Equation (1) as described below:

$$I2 = \left(IREF * \left(\frac{R3}{R1}\right)\right) + \frac{(VOUT - VREF1)}{R1} \quad \text{Equation (1)}$$

In FIG. 4, VG of MN1 320 has a value corresponding to Equation (2) as described below:

$$VG = VGS4 + (I2 * R2) \quad \text{Equation (2)}$$

In the example of Equation (2) above, VGS4 refers to the gate-to-source voltage of MN4 414. When VOUT 310 reduces to and/or otherwise becomes $V_{2LOFF}$ 119, the voltage at the source 430 of MP1 324 is less than a sum of (1) VREF2 470 and (2) a turn-on threshold voltage of MP1 432 at the gate 462 of MP1 418 and, thus, causes MP1 418 to turn off. In such examples, the assumption is IREF is substantially small (e.g., approximately zero, equal to zero, etc.) when VOUT 310 is $V_{2LOFF}$ 119. When MP1 418 turns off, MN4 414 and MN1 320 turn off. When MN1 320 turns off, VOUT 310 stops discharging through MN1 320. When MN1 320 turns off, the external parasitic capacitance 404 maintains VOUT 310 at $V_{2LOFF}$ 119.

In the illustrated example of FIG. 4, the voltage-current-voltage buffer 401 operates and/or otherwise functions as a current comparator. The voltage-current-voltage buffer 401 is a portion of the low-frequency loop discussed above in connection with FIG. 3. Accordingly, MN3 412, MP2 420, and MN5 416 operate to generate and/or otherwise cause a current greater than IREF 326 (e.g., a current corresponding to IREF*(R3/R2)) to flow through the voltage-current-voltage buffer 401 and produce VREF2 470 at the gate 462 of MP1 418. When VOUT 310 is above a pre-defined threshold voltage (e.g., $V_{2LOFF}$ 119), MP1 418 turns on to turn on MN1 320 and discharge VOUT 310 to the pre-defined threshold voltage. When VOUT 310 is below the pre-defined threshold voltage, MP1 418 turns off to turn off MN1 320 to stop discharging VOUT 310 and to maintain VOUT 310 at the pre-defined threshold voltage by storing the pre-defined threshold voltage using the external parasitic capacitance 404. Advantageously, the voltage-current-voltage buffer 401 reduces VOUT 310 to a desired 2LTO intermediate voltage level, the high-frequency loop circuit 402 reduces the slew rate of the voltage reduction of VOUT 310 to a desired slew rate, and the external parasitic capacitance 404 maintains the voltage of VOUT 310 at the desired 2LTO intermediate voltage level using less area (e.g., less space on a semiconductor substrate) and less power dissipation when compared to a closed-loop circuit implementation. Advantageously, the 2LTO circuit 212 of FIGS. 2-3 supports a wide range of capacitance values for the external parasitic capacitance 404 by controlling the quantity of voltage reduction using the voltage-current-voltage buffer 401 and by controlling the slew rate using the high-frequency loop circuit 402.

Figure 5:
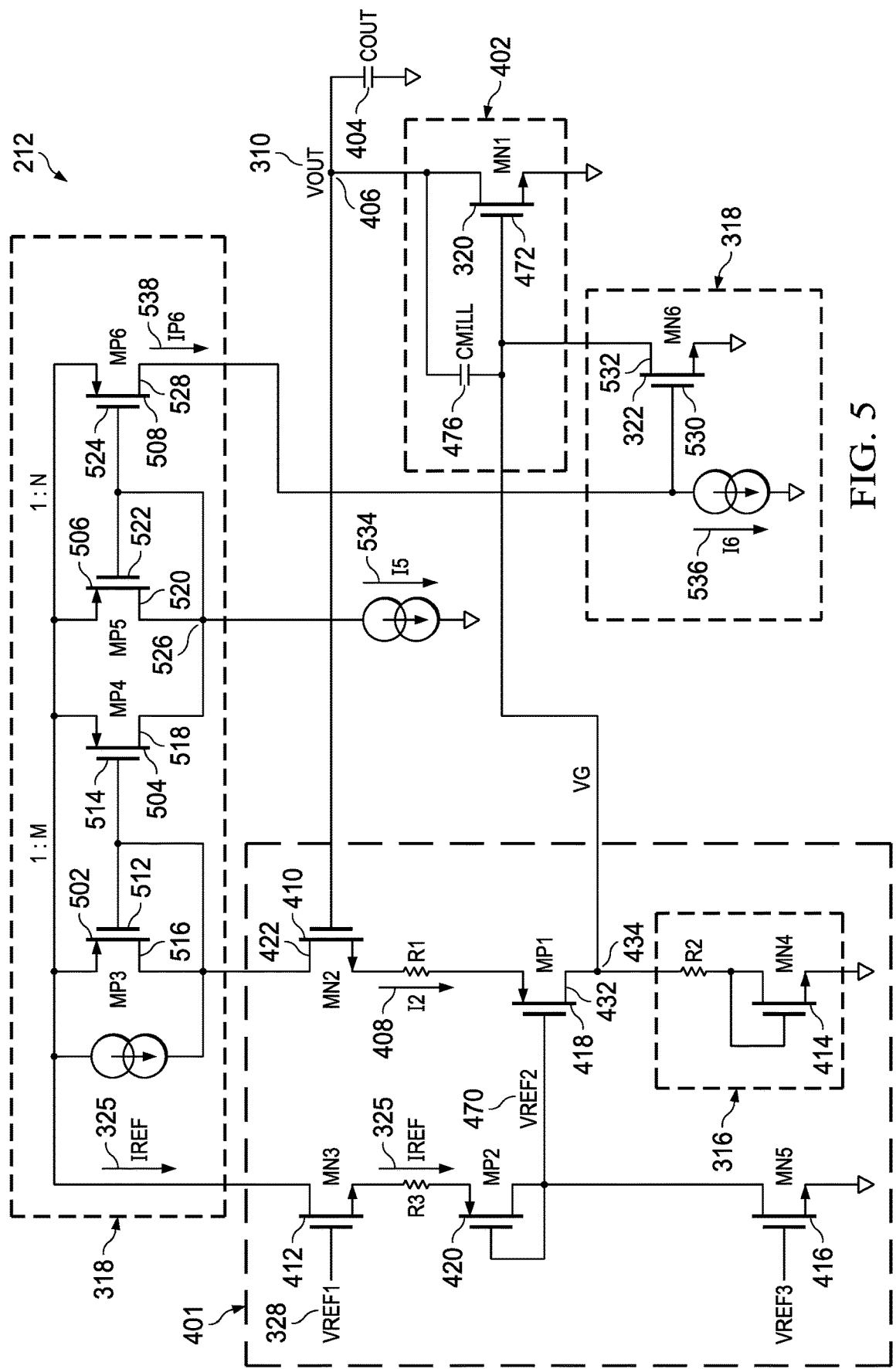
FIG. 5 is a schematic illustration of the example two-level turn-off circuit of FIG. 2 including the example voltage-current-voltage buffer of FIG. 4 and an example comparator circuit to implement the examples disclosed herein.

FIG. 5 is a schematic illustration of the 2LTO circuit 212 of FIGS. 2-4 including the voltage-current-voltage buffer 401 of FIG. 4, the high-frequency loop circuit 402 of FIG. 4, and the comparator circuit 318 of FIG. 3. In FIG. 5, the comparator circuit 318 is a current-to-voltage circuit that turns off MN1 320 when VOUT 310 reaches and/or otherwise becomes $V_{2LOFF}$ 119 of FIG. 1B. In FIG. 5, ones of the reference numbers from FIG. 4 associated with the 2LTO circuit 212 have been omitted for clarity. Unless otherwise noted, components, nodes, etc., included in FIG. 5 have the same reference numbers as in FIG. 4 even though the reference numbers are not included in FIG. 5.

In the illustrated example of FIG. 5, the 2LTO circuit 212 includes the comparator circuit 318 to disable the discharge path of VOUT 310 when the threshold voltage (e.g., $V_{2LOFF}$ 119) is reached. In FIG. 5, the comparator circuit 318 includes a third example P-channel MOSFET (MP3) 502, a fourth example P-channel MOSFET (MP4) 504, a fifth example P-channel MOSFET (MP5) 506, a sixth example P-channel MOSFET (MP6) 508, and MN6 322. Alternatively, MN6 322 may not be included in the comparator circuit 318.

In the illustrated example of FIG. 5, an example gate 512 of MP3 502 is coupled to an example gate 514 of MP4 504. In FIG. 5, MP3 502 and MP4 504 correspond to a first example current mirror. An example drain 516 of MP3 502 is coupled to the drain 422 of MN2 410. An example drain 518 of MP4 504 is coupled to an example drain 520 of MP5 506. An example gate 522 of MP5 506 is coupled to an example gate 524 of MP6 508. In FIG. 5, MP5 506 and MP6 508 correspond to a second example current mirror. The drain 518 of MP4 504, the drain 520 of MP5 506, the gate 522 of MP5 506, and the gate 524 of MP6 508 are coupled at an example comparator node 526. An example drain 528 of MP6 508 is coupled to an example gate 530 of MN6 322. An example drain 532 of MN6 322 is coupled to the gate 472 of MN1 320. The drain 532 of MN6 322 is coupled to the drain 432 of MP1 418 at the gate node 434. The drain 532 of MN6 322 is coupled to the Miller capacitor 319.

In operation, when VOUT 310 reaches $V_{2LOFF}$ 119, I2 408 has a value corresponding to IREF*(R3/R1) and the current through MP3 502 reduces to zero and/or otherwise stops flowing through MP3 502. When the current through MP3 502 reduces to zero, the current through MP4 504 reduces to zero because MP4 504 is a current mirror of MP3 502. When the through current MP4 504 reduces to zero, the current flowing through MP5 506 becomes an example current I5 534. When I5 534 is flowing through MP5 506, an example current MP6 538 flows through MP6 508. In FIG. 5, MP6 538 is N times greater than I5 534. For example, MP6 508 can have N times less drain-to-source resistance than the drain-to-source resistance of MP5 506 and, thus, allows N times greater current to flow through MP6 508 compared to MP5 506. For example, N can be 50. In such examples, I6 536 is 50 times greater than I5 534. In other examples, N can be any other number. When MP6 538 is flowing through MP6 508 and is higher than I6 536, MP6 538 turns on MN6 322 which, in turn, switches off and/or otherwise disables MN1 320. When MN6 322 switches off MN1 320, MN1 320 stops discharging VOUT 310 and causes the external parasitic capacitance 404 of FIG. 4 to maintain VOUT 310 at $V_{2LOFF}$ 119.

In some examples, the comparator circuit 318 begins to trip and/or otherwise become enabled when current through MP3 502 has a value corresponding to I5/M. For example, M can have a value of 3. In such examples, the comparator circuit 318 can begin to trip (e.g., can reduce the current through MP3 502 and MP4 504 to zero) when the current through MP3 502 is I5/3. In other examples, M can be any other number. When the comparator circuit 318 trips when I5/M, the 2LTO circuit 212 can create an offset to counter a delay introduced by the comparator circuit 318. For example, the comparator circuit 318 can begin to turn off MN1 320 by turning off MN6 322 prior to VOUT 310 reaching $V_{2LOFF}$ 119.

Figure 6:
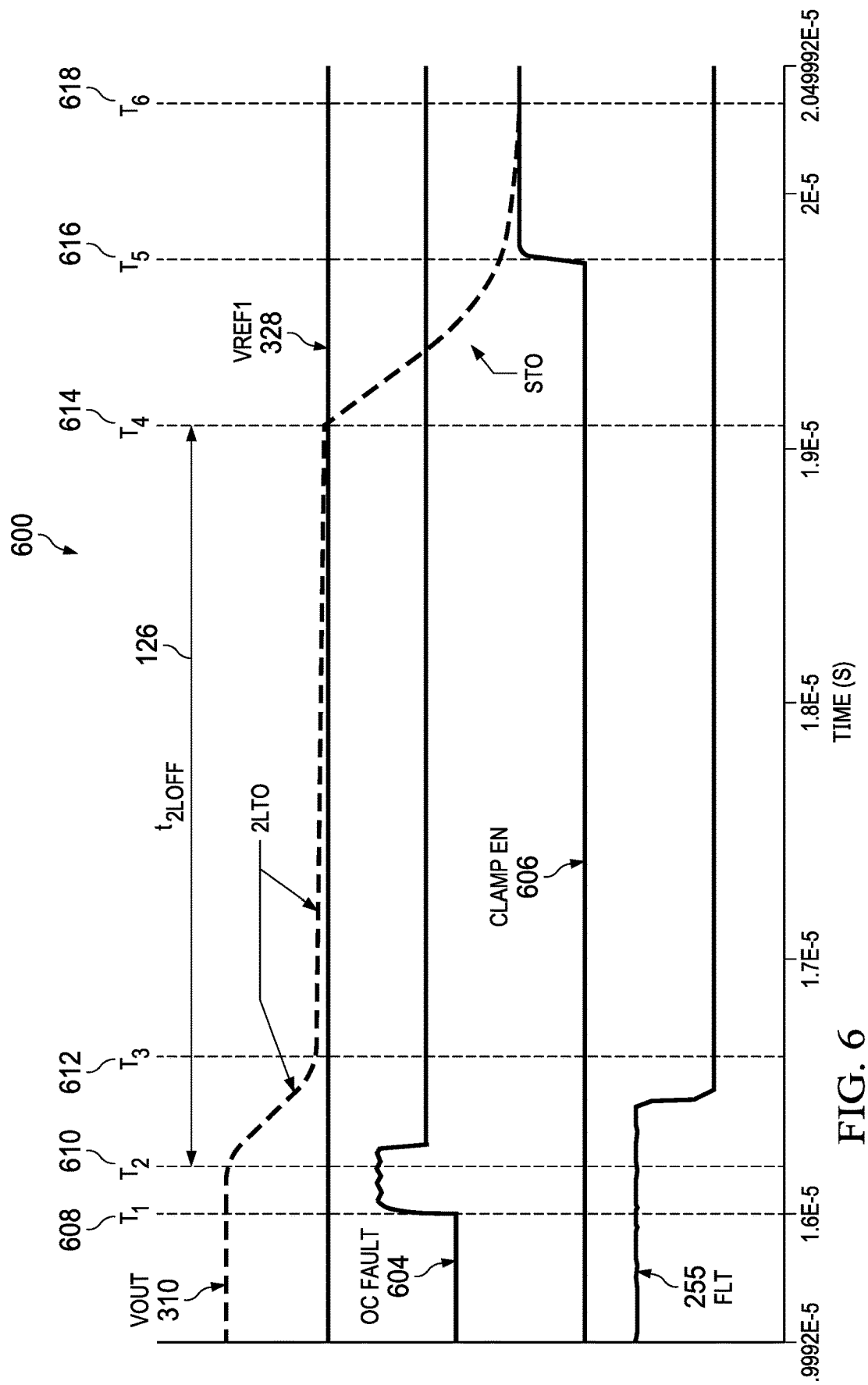
FIG. 6 depicts an example timing diagram corresponding to operation of the example output stage circuit of FIG. 2 in response to an over-current condition of the example switch of FIG. 2.

FIG. 6 depicts an example timing diagram 600 corresponding to operation of the output stage circuit 204 of FIG. 2 in response to an over-current condition of the switch 206 of FIG. 2. Depicted in the illustrated example of FIG. 6 are example waveforms for VOUT 310 of FIG. 3, VREF1 328 of FIG. 3, an example OC fault signal 602, an example clamp enable (EN) signal 604, and the seventh pin 255 (FLT) of FIG. 2. In FIG. 6, the OC fault signal 602 corresponds to an output of the OCP circuit 226 of FIG. 2. In FIG. 6, the clamp enable signal 604 corresponds to an input of the fourth buffer 350 of FIG. 3.

In the timing diagram 600 of FIG. 6, at a first example time ($T_1$) 608, the OUTH P-channel MOSFET 308 of FIG. 3 is enabled and causes power to be delivered to the load 356 of FIG. 3. At the first time 608, the FLT signal 255 and the OC fault signal 602 correspond to a logic High because the current flowing through the switch 206 is greater than an over-current threshold. For example, a voltage measured at the fourth pin 228 of FIG. 2 can be greater than a pre-defined voltage indicative that the current flowing from the sense terminal 230 of FIG. 2 is greater than an over-current threshold. At the first time 608, VOUT 310 is greater than VREF1 328.

In the illustrated example of FIG. 6, at a second example time ($T_2$) 610, the 2LTO circuit 212 begins to reduce VOUT 310. For example, the voltage-current-voltage buffer 401 of FIG. 3 can reduce the pull-down current I2 408 of FIG. 4 and, thus, reduce VOUT 310 at the 2LTO circuit output node 406 of FIG. 4. In some examples, at the second time 610, the high-frequency loop circuit 402 of FIG. 4 reduces the slew rate associated with reducing VOUT 310. At a third example time ($T_3$) 612, the 2LTO circuit 212 turns off MN1 320 of FIG. 3 when VOUT 310 reaches VREF1 328. For example, the comparator circuit 318 of FIGS. 3-4 can turn on MN6 322 of FIG. 3 to turn off MN1 320.

In the timing diagram 600 of FIG. 6, at a fourth example time ($T_4$) 614, the OUTL driver 210 turns on the STO N-channel MOSFET 338 of FIG. 3 to reduce VOUT 310 from VREF1 328. For example, after $t_{2LOFF}$ 126 of FIG. 1B has elapsed, the OUTL pre-driver circuit 334 can turn on the STO N-channel MOSFET 338 to reduce VOUT 310. At a fifth example time ($T_5$) 616, the clamp circuit 214 of FIG. 2 is enabled to turn off the switch 206. For example, the fourth buffer 350 of FIG. 3 can turn on the clamp N-channel MOSFET 354 to increase the pull-down strength. At a sixth example time (T₆) 618, VOUT 310 is below the turn-on threshold of the switch 206 to cause the switch 206 to turn off. After the sixth time 618, the OUTH driver 208 turns on the switch 206 to resume delivering power to the load 356.

Figure 7:
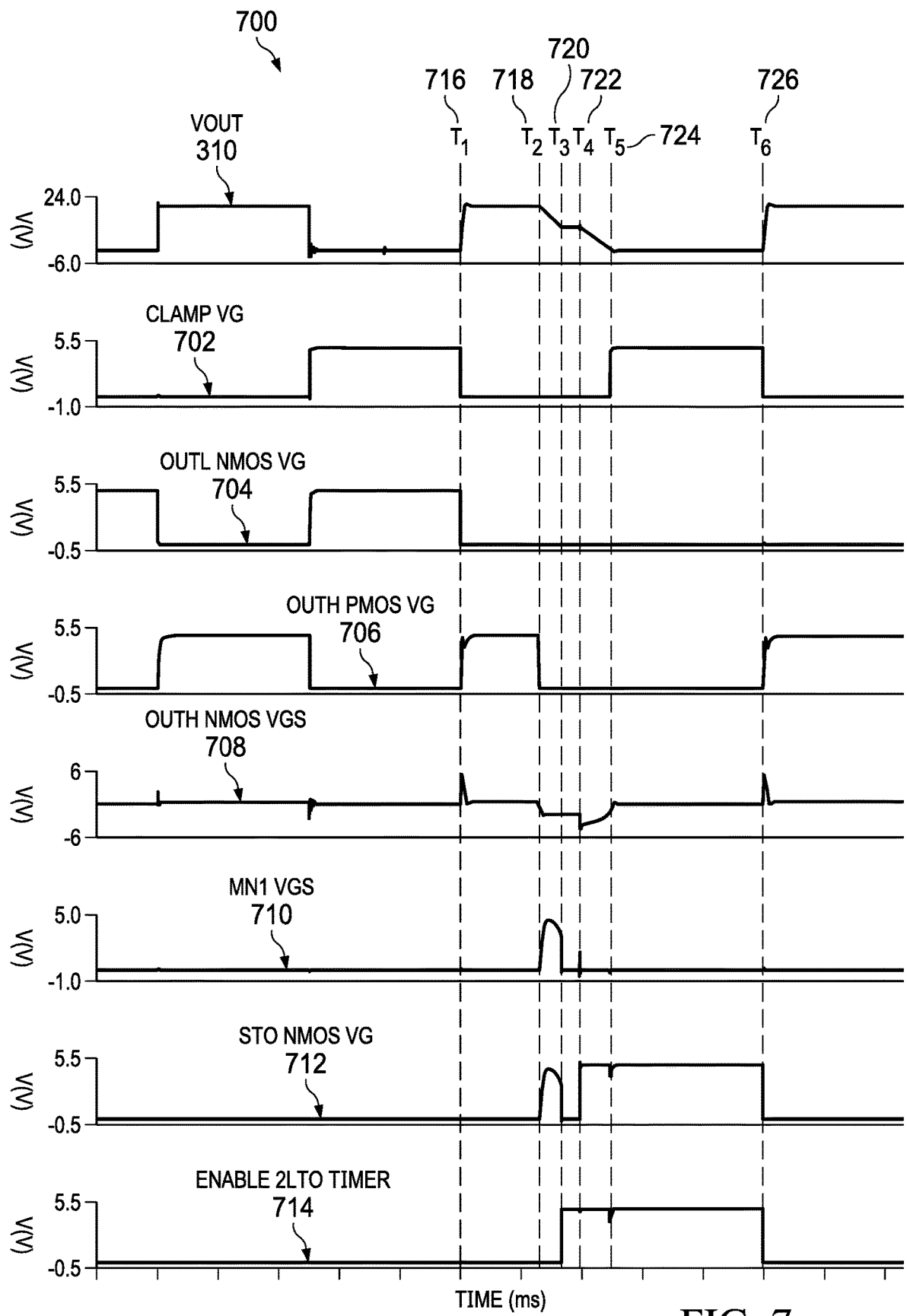
FIG. 7 depicts another example timing diagram corresponding to operation of the example output stage circuit of FIG. 2 in response to an over-current condition of the example switch of FIG. 2.

FIG. 7 depicts another example timing diagram 700 corresponding to operation of the output stage circuit 204 of FIG. 2 in response to an over-current condition of the switch 206 of FIG. 2. The timing diagram 700 of FIG. 7 depicts example waveforms for VOUT 310 of FIG. 3, an example clamp VG 702, an example OUTL NMOS VG 704, an example OUTH PMOS VG 706, an example OUTH NMOS VGS 708, an example MN1 VGS 710, an example STO NMOS VG 712, and an example enable 2LTO timer 714.

In the illustrated example of FIG. 7, the clamp VG 702 corresponds to a voltage at the gate 352 of the clamp N-channel MOSFET 354 of FIG. 3. In FIG. 7, the OUTL NMOS VG 704 corresponds to a voltage at the gate 340 of the OUTL N-channel MOSFET 336 of FIG. 3. In FIG. 7, the OUTH PMOS VG 706 corresponds to a voltage at the gate of the OUTH P-channel MOSFET 308 of FIG. 3. In FIG. 7, the OUTH NMOS VGS 708 corresponds to a gate-to-source voltage of the OUTH N-channel MOSFET 309 of FIG. 3. In FIG. 7, the MN1 VGS 710 corresponds to a gate-to-source voltage of MN1 320 of FIG. 3. In FIG. 7, the STO NMOS VG 712 corresponds to a voltage at the gate 342 of the STO N-channel MOSFET 338 of FIG. 3. In FIG. 7, the enable 2LTO timer 714 corresponds to a timer that, when enabled, causes VOUT 310 to remain at $V_{2LOFF}$ 318 from the third time 122 until the fourth time 124 of FIG. 1B.

In the timing diagram 700 of FIG. 7, at a first example time (T₁) 716, the OUTH driver 208 turns on the OUTH P-channel MOSFET 308 and the OUTH N-channel MOSFET 309 of FIG. 3. For example, the OUTH driver 208 can turn on the OUTH P-channel MOSFET 308 by increasing the OUTH PMOS VG 706 to exceed the turn-on threshold of the OUTH P-channel MOSFET 308. Unlike the OUTH P-channel MOSFET 308, the OUTH driver 208 can cause the OUTH NMOS VGS 708 to exceed the turn-on threshold of the OUTH N-channel MOSFET 309 only during the rising edge of the control signal from the OUTH pre-driver circuit 302 of FIG. 3. At a second example time (T₂) 718, the OUTH driver 208 turns off the OUTH P-channel MOSFET 308. At the second time 718, the 2LTO circuit 212 begins to perform a first level turn-off by turning on MN1 320 and reducing VOUT 310. From the second time 718 until a third example time (T₃) 720, the 2LTO circuit 212 maintains MN1 320 in the on state. At the third time 720, VOUT 310 reaches VREF1 328 of FIG. 3. For example, VOUT 310 can reach $V_{2LOFF}$ 119 of FIG. 1B. At the third time 720, when VOUT 310 reaches VREF1 328, the 2LTO circuit 212 turns off MN1 320 by turning on MN6 322 of FIG. 3. The 2LTO circuit 212 maintains VOUT 310 at VREF1 328 from the third time 720 until a fourth example time (T₄) 722. The time period from the second time 718 to the fourth time 722 can correspond to $t_{2LOFF}$ 126 of FIG. 1B.

In the timing diagram 700 of FIG. 7, at the fourth time 722, the OUTL driver 210 turns on the STO N-channel MOSFET 338 of FIG. 3 to reduce VOUT 310. At a fifth example time (T₅) 724, the OUTL driver 210 reduces VOUT 310 to a voltage corresponding to a clamp threshold voltage that turns on and/or otherwise enables the clamp N-channel MOSFET 354 of FIG. 3. At the fifth time 724, the STO N-channel MOSFET 338 turns off. At the fifth time 724, the clamp N-channel MOSFET 354 turns on to maintain MN1 320 in the off state. At a sixth example time (T₆) 726, the OUTH driver 208 turns on at least one of the OUTH P-channel MOSFET 308 or the OUTH N-channel MOSFET 309 to increase VOUT 310 above a turn-on voltage of the switch 206. The switch 206 resumes delivering power to the load 356 after turning on.

Figure 8:
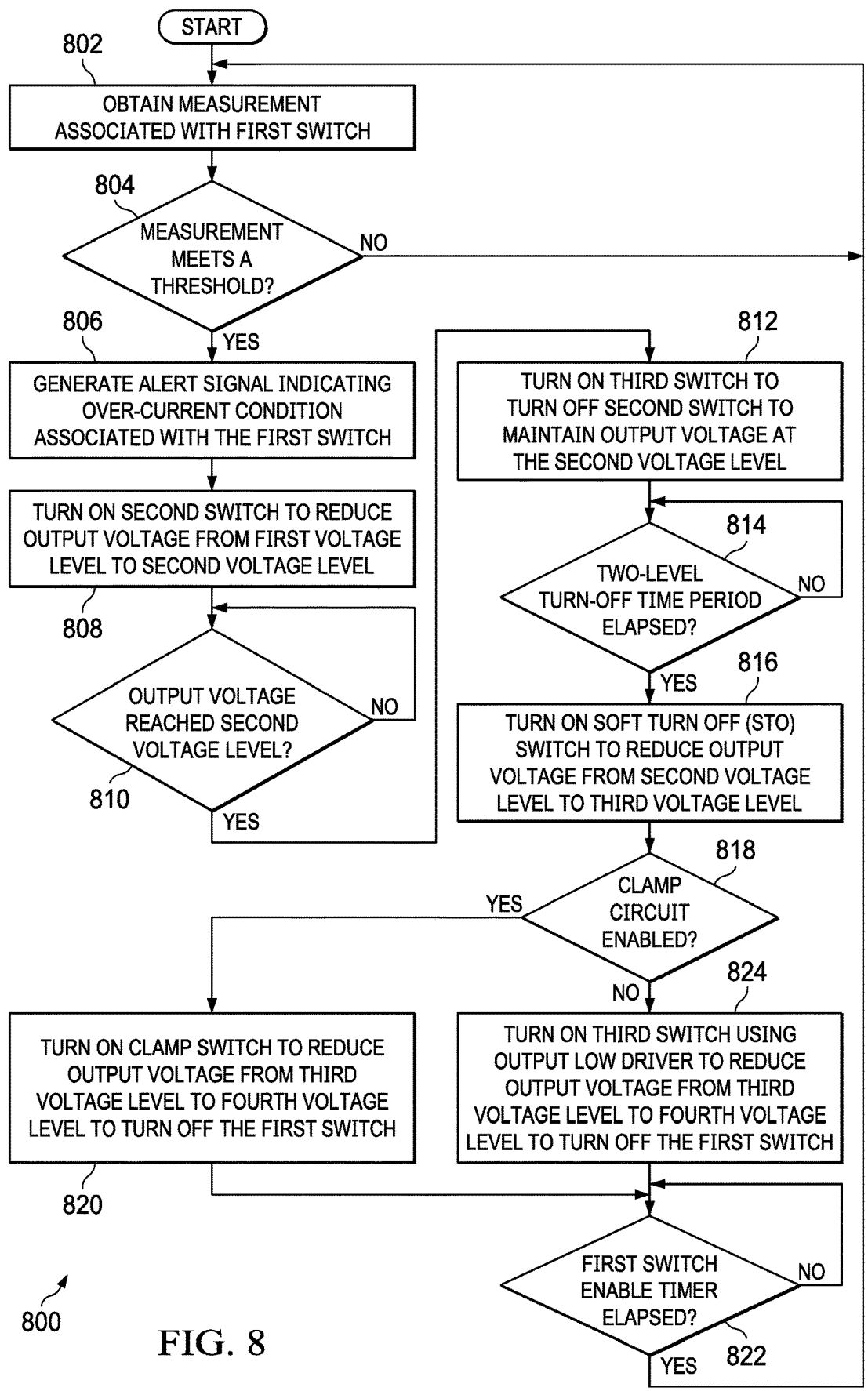
FIG. 8 is a flowchart representative of example machine readable instructions that may be executed to implement the example controller of FIG. 2 to facilitate operation of the two-level turn-off circuit of FIG. 2.

A flowchart representative of example hardware logic, machine readable instructions, hardware implemented state machines, and/or any combination thereof for implementing the example controller 234 and/or the example gate driver integrated device 202 of FIGS. 2-3 is shown in FIG. 8. The machine readable instructions may be an executable program or portion of an executable program for execution by the controller 234 and/or the gate driver integrated device 202. The program may be embodied in software stored on a non-transitory computer readable storage medium such as non-volatile memory, volatile memory, etc., associated with the controller 234 and/or the gate driver integrated device 202, but the entire program and/or parts thereof could alternatively be executed by a device other than the controller 234 and/or the gate driver integrated device 202 and/or embodied in firmware or dedicated hardware. Further, although the example program is described with reference to the flowchart illustrated in FIG. 8, many other methods of implementing the example controller 234 and/or the example gate driver integrated device 202 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example processes of FIG. 8 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory, and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

FIG. 8 is a flowchart representative of example machine readable instructions 800 that may be executed to implement the controller 234 and/or the gate driver integrated device 202 of FIGS. 2-3 to turn off the switch 206 of FIG. 2 in two or more levels, stages, operations, steps, etc. Alternatively, FIG. 8 may be implemented using hardware logic, hardware implemented state machines, etc., and/or a combination thereof. Alternatively, FIG. 8 may be implemented using one or more analog or digital circuit(s), logic circuits, programmable processor(s), programmable controller(s), GPU(s), DSP(s), ASIC(s), PLD(s), and/or FPLD(s). The machine readable instructions 800 of FIG. 8 begin at block 802, at which the gate driver integrated device 202 obtains a measurement associated with a first switch. For example, the OCP circuit 226 of FIG. 2 can obtain a voltage measurement that corresponds to a quantity of current flowing through the switch 206 via the fourth pin 228 of FIG. 2.

At block 804, the gate driver integrated device 202 determines whether the measurement meets a threshold. For example, the OCP circuit 226 can determine that the quantity of current associated with the measurement is greater than an over-current threshold by (1) comparing a voltage across the sense resistor 232 of FIG. 2 to a threshold voltage corresponding to an over-current condition and (2) determining that the voltage satisfies and/or otherwise meets the threshold voltage based on the comparison (e.g., the voltage is greater than the threshold voltage).

If, at block 804, the gate driver integrated device 202 determines that the measurement does not meet the threshold, control returns to block 802 to obtain another measurement associated with the first switch. If, at block 804, the gate driver integrated device 202 determines that the measurement meets the threshold, then, at block 806, the gate driver integrated device 202 generates an alert signal indicative of an over-current condition associated with the first switch. For example, the OCP circuit 226 can generate a fault signal when the OCP circuit 226 determines that a quantity of current flowing through the switch 206 (e.g., a current obtained from the sense terminal 230 of FIG. 2) is greater than an over-current threshold. The controller 234 can obtain the fault signal from the OCP circuit 226 via the fault encode circuit 248 of FIG. 2. The controller 234 can determine that the fault signal is indicative of an over-current condition. The controller 234 can determine that a quantity of current flowing through the switch 206 is greater than an over-current threshold based on the fault signal.

At block 808, the gate driver integrated device 202 turns on a second switch to reduce an output voltage from a first voltage level to a second voltage level. For example, the gate driver integrated device 202 can turn on MN1 320 of FIG. 3 to reduce VOUT 310 of FIG. 3 from a first voltage level (e.g., the first voltage 116 of FIG. 1B) to a second voltage level (e.g., the second voltage 118 of FIG. 1B, $V_{2LOFF}$ 119 of FIG. 1B, etc.). In other examples, when VOUT 310 is greater than VREF1 328 of FIG. 3, the voltage-current-voltage buffer 401 of FIG. 4 turns on MN1 320 to reduce VOUT 310 to VREF1 328.

At block 810, the gate driver integrated device 202 determines whether the output voltage has reached the second voltage level. For example, the voltage-current-voltage buffer 401 can determine that VOUT 310 has reached VREF1 328. If, at block 810, the gate driver integrated device 202 determines that the output voltage has not reached the second voltage level, control waits at block 810. If, at block 810, the gate driver integrated device 202 determines that the output voltage has reached the second voltage level, then, at block 812, the gate driver integrated device 202 turns on a third switch to turn off the second switch to maintain the output voltage at the second voltage level. For example, the gate driver integrated device 202 can turn on MN6 322 of FIG. 3 to turn off MN1 320 to maintain VOUT 310 at VREF1 328. In such examples, VOUT 310 is maintained and/or is otherwise stored by the external parasitic capacitance 404 of FIGS. 4-5. In other examples, when VOUT 310 is approximately equal to VREF1 328, the comparator circuit 318 of the 2LTO circuit 212 turns on MN6 322 to turn off MN1 320 to maintain VOUT 310 as VREF1 328.

At block 814, the gate driver integrated device 202 determines whether a two-level turn-off time period has elapsed. For example, the 2LTO circuit 212 can determine that $t_{2LOFF}$ 126 of FIG. 1B has expired. In other examples, the 2LTO circuit 212 can determine that the time period from the second time 120 of FIG. 1B to the fourth time 124 of FIG. 1B has ended.

If, at block 814, the gate driver integrated device 202 determines that the two-level turn-off time period has not elapsed, control waits at block 814. If, at block 814, the gate driver integrated device 202 determines that the two-level turn-off time period has elapsed, then, at block 816, the gate driver integrated device 202 turns on a soft turn off (STO) switch to reduce the output voltage from the second voltage level to a third voltage level. For example, the OUTL pre-driver circuit 334 can turn on the STO N-channel MOSFET 338 of FIG. 3 to reduce the output voltage from the second voltage level (e.g., the second voltage 118 of FIG. 1B, $V_{2LOFF}$ 119 of FIG. 1B, etc.) to a third voltage level (e.g., the third voltage 121 of FIG. 1B, the clamp voltage threshold at the fifth time 128 of FIG. 1B, etc.).

At block 818, the gate driver integrated device 202 determines whether a clamp circuit is enabled. For example, the OUTL pre-driver circuit 334 of the OUTL driver 210 can determine that the clamp circuit 214 of FIG. 2 is not included in the output stage circuit 204 or is included in the output stage circuit 204 but is disabled.

If, at block 818, the gate driver integrated device 202 determines that the clamp circuit is enabled, then, at block 820, the gate driver integrated device 202 turns on a clamp switch to reduce the output voltage from the third voltage level to a fourth voltage level to turn off the first switch. For example, the OUTL LDO regulator 348 of the clamp circuit 214 can instruct the fourth buffer 350 of FIG. 3 to turn on the clamp N-channel MOSFET 354 of FIG. 3. In such examples, VOUT 310 is reduced to a fourth voltage level (e.g., the fourth voltage 123 of FIG. 1B) corresponding to a voltage below the turn-on voltage of the switch 206 when the clamp N-channel MOSFET 354 is turned on. In other examples, the OUTL LDO regulator 348 of the clamp circuit 214 can instruct the fourth buffer 350 to turn on the clamp N-channel MOSFET 354 to reduce VOUT 310 to a voltage below the turn-on voltage of the switch 206. In response to turning off the first switch at block 820, control proceeds to block 822 to determine whether a first switch enable timer has elapsed.

If, at block 818, the gate driver integrated device 202 determines that the clamp circuit is not enabled, then, at block 824, the gate driver integrated device 202 turns on a third switch using an output low driver to reduce the output voltage from the third voltage level to a fourth voltage level to turn off the first switch. For example, the OUTL pre-driver circuit 334 of the OUTL driver 210 can turn on the OUTL N-channel MOSFET 336 of FIG. 3. In such examples, VOUT 310 is reduced to a fourth voltage level (e.g., the fourth voltage 123 of FIG. 1B) corresponding to a voltage below the turn-on voltage of the switch 206 to turn off the switch 206 when the OUTL N-channel MOSFET 336 is turned on. In other examples, the OUTL pre-driver circuit 334 of the OUTL driver 210 turns on the OUTL N-channel MOSFET 336 to reduce and/or otherwise pulldown VOUT 310 to a voltage below the turn-on voltage of the switch 206 to turn off the switch 206.

In response to turning off the first switch at block 824, control proceeds to block 822 to determine whether a first switch enable timer has elapsed. For example, the OUTL pre-driver circuit 334 can determine that a time period from the third time 720 to the sixth time 726 of FIG. 7 corresponding to the enable 2LTO timer 714 of FIG. 7 has elapsed.

If, at block 822, the gate driver integrated device 202 determines that the first switch enable timer has not elapsed, control waits at block 822. If, at block 822, the gate driver integrated device 202 determines that the first switch enable timer has elapsed, control returns to block 802 to obtain a measurement associated with the first switch. For example, the OUTH driver 208 can turn on the switch 206 to deliver power to the load 356 of FIG. 3. In other examples, the OUTH pre-driver circuit 302 of the OUTH driver 208 can turn on at least one of the OUTH P-channel MOSFET 308 or the OUTH N-channel MOSFET 309 to turn on the switch 206 to deliver power to the load 356.

From the foregoing, it will be appreciated that example methods, apparatus, and articles of manufacture have been disclosed that provide a multi-level turn-off of power switching devices with a low-current consumption, fast settling to a desired voltage level, and mitigation mechanisms to avoid undershoots beyond a desired level. Advantageously, the disclosed methods, apparatus, and articles of manufacture mitigate surge spikes during an ON-OFF transition of SiC FETs and/or IGBT devices for EV and HEV traction inverters and power modules. The disclosed methods, apparatus and articles of manufacture improve the efficiency of switching off a power switching devices by including a low-frequency circuit loop to reduce discharge current as the output voltage approaches a desired voltage level, a higher frequency loop circuit that provides high negative feedback in case the output voltage slew rate is high, a fast comparator to cut off the discharge current to 0 A as the output voltage reaches the desired voltage level, and a soft turn-off pull-down beyond reaching the desired voltage level to ensure surge spikes are mitigated during the complete turn-off cycle and not only during the initial 2LTO phase. The disclosed methods, apparatus and articles of manufacture are accordingly directed to one or more improvement(s) in the functioning of hardware associated with the practical application of power delivering devices included in and/or otherwise associated with EV and HEV.

The following pertain to further examples disclosed herein.

Example 1 includes a power delivery circuit comprising a two-level turn-off circuit to be coupled to a first switch to reduce a first gate voltage of the first switch from a first voltage to a second voltage when a current flowing through the first switch is greater than an over-current threshold, the two-level turn-off circuit including a second switch, a voltage-current-voltage buffer to reduce a second gate voltage of the second switch from a third voltage to a fourth voltage, and a comparator circuit to turn off the second switch when the second gate voltage is the fourth voltage, and a driver to be coupled to the first switch to turn off the first switch when the second gate voltage is the fourth voltage.

Example 2 includes the power delivery circuit of example 1, wherein the first switch is a silicon carbide field-effect transistor and the second switch is an N-channel metal-oxide-semiconductor field-effect transistor (MOSFET).

Example 3 includes the power delivery circuit of example 1, wherein the first gate voltage is to be reduced from the first voltage to the second voltage when the voltage-current-voltage buffer reduces the second gate voltage to the fourth voltage.

Example 4 includes the power delivery circuit of example 1, wherein the second switch is a first N-channel metal-oxide-semiconductor field-effect transistor (MOSFET), and the voltage-current-voltage buffer includes a first resistor, a second resistor, a third resistor, a second N-channel MOSFET coupled to a first end of the first resistor, a first P-channel MOSFET including a first gate, the first P-channel MOSFET coupled to a second end of the first resistor and to a first end of the second resistor, a third N-channel MOSFET coupled to a first end of the third resistor, a second P-channel MOSFET including a second gate, the second P-channel MOSFET coupled to a second end of the third resistor, the first gate coupled to the second gate, a fourth N-channel MOSFET coupled to a second end of the second resistor, and a fifth N-channel MOSFET including a current terminal, the current terminal coupled to the first gate and the second gate.

Example 5 includes the power delivery circuit of example 4, wherein the current terminal is a first current terminal, the first N-channel MOSFET including a second current terminal and a third gate, the first P-channel MOSFET including a third current terminal, and further including a capacitor coupled to the third gate and the second current terminal, the third gate coupled to the third current terminal and the first end of the second resistor.

Example 6 includes the power delivery circuit of example 1, wherein the second switch is a first N-channel metal-oxide-semiconductor field-effect transistor (MOSFET), and the comparator circuit includes a first P-channel MOSFET coupled to a second N-channel MOSFET of the voltage-current-voltage buffer, a second P-channel MOSFET coupled to the first P-channel MOSFET, a third P-channel MOSFET coupled to the second P-channel MOSFET, a fourth P-channel MOSFET coupled to the third P-channel MOSFET, and a third N-channel MOSFET coupled to the fourth P-channel MOSFET and the first N-channel MOSFET.

Example 7 includes the power delivery circuit of example 6, wherein the first N-channel MOSFET turns off when the third N-channel MOSFET turns on when a first current associated with the third N-channel MOSFET becomes greater than a second current associated with the fourth P-channel MOSFET.

Example 8 includes a multi-level turn-off circuit comprising a first N-channel metal-oxide-semiconductor field-effect transistor (MOSFET) including a first gate and a first current terminal, the first current terminal to be coupled to be coupled to a switch, a second N-channel MOSFET including a second gate and a second current terminal, the second current terminal coupled to the first gate, a voltage-current-voltage buffer coupled to the first gate and the second current terminal, a comparator circuit coupled to the second gate and the voltage-current-voltage buffer, and a capacitor coupled to the first gate and the second current terminal.

Example 9 includes the multi-level turn-off circuit of example 8, further including a resistor, a first unity gain buffer coupled to the voltage-current-voltage buffer and a first end of the resistor, and a second unity gain buffer coupled to the comparator circuit and a second end of the resistor.

Example 10 includes the multi-level turn-off circuit of example 8, wherein the switch is a silicon carbide field-effect transistor to be included in an electric vehicle or a hybrid-electric vehicle.

Example 11 includes the multi-level turn-off circuit of example 8, wherein the second N-channel MOSFET is a sixth N-channel MOSFET, and the voltage-current-voltage buffer includes a first resistor, a second resistor, a third resistor, a second N-channel MOSFET coupled to a first end of the first resistor, a third N-channel MOSFET coupled to a first end of the third resistor, a fourth N-channel MOSFET coupled to a second end of the second resistor, a first P-channel MOSFET coupled to a second end of the first resistor and to a first end of the second resistor, a second P-channel MOSFET coupled to a second end of the third resistor, and a fifth N-channel MOSFET coupled to the first P-channel MOSFET and the second P-channel MOSFET.

Example 12 includes the multi-level turn-off circuit of example 11, wherein the first P-channel MOSFET includes a first gate, a third current terminal, and a fourth current terminal, the second N-channel MOSFET includes a fifth current terminal, the third N-channel MOSFET includes a sixth current terminal, the fourth N-channel MOSFET includes a seventh current terminal, the second P-channel MOSFET includes a second gate and an eighth current terminal, the third current terminal is coupled to the second end of the first resistor, the fifth current terminal is coupled to the first end of the first resistor, the sixth current terminal is coupled to the first end of the third resistor, the eighth current terminal is coupled to the second end of the third resistor, the fourth current terminal is coupled to the first end of the second resistor, the seventh current terminal is coupled to the second end of the second resistor, and the first gate is coupled to the second gate.

Example 13 includes the multi-level turn-off circuit of example 8, wherein the second N-channel MOSFET is a sixth N-channel MOSFET, and the comparator circuit includes a first P-channel MOSFET coupled to a second N-channel MOSFET of the voltage-current-voltage buffer, a second P-channel MOSFET coupled to the first P-channel MOSFET, a third P-channel MOSFET coupled to the second P-channel MOSFET, and a fourth P-channel MOSFET coupled to the third P-channel MOSFET and the sixth N-channel MOSFET.

Example 14 includes the multi-level turn-off circuit of example 13, wherein a third gate of the first P-channel MOSFET is coupled to a fourth gate of the second P-channel MOSFET and a third current terminal of a third N-channel MOSFET of the voltage-current-voltage buffer, a fourth current terminal of the second P-channel MOSFET is coupled to a fifth current terminal of the third P-channel MOSFET and a fifth gate of the third P-channel MOSFET, and a sixth current terminal of the fourth P-channel MOSFET is coupled to the second gate.

Example 15 includes a power delivery system comprising a first switch to be coupled to a load, and a gate driver integrated device to be coupled to the first switch, the gate driver integrated device including an over-current protection circuit to determine that a current associated with the first switch meets an over-current threshold, and an output stage circuit, the output stage circuit, when the current meets the over-current threshold, to reduce a first gate voltage of the first switch from a first voltage to a second voltage by reducing a second gate voltage of a second switch from a third voltage to a fourth voltage, reduce the first gate voltage from the fourth voltage to a fifth voltage by turning on a first transistor, and when a pre-determined time period has elapsed, turn off the first switch by turning on a second transistor.

Example 16 includes the power delivery system of example 15, wherein the first switch is a silicon carbide field-effect transistor to be included in an electric vehicle or a hybrid-electric vehicle.

Example 17 includes the power delivery system of example 15, wherein the gate driver integrated device includes an output high driver to turn on the first switch and an output low driver to turn off the first switch, and further including a controller coupled to the gate driver integrated device to generate a control signal to be obtained by the output high driver or the output low driver to facilitate operation of the first switch.

Example 18 includes the power delivery system of example 15, wherein the second switch is a first N-channel metal-oxide-semiconductor field-effect transistor (MOSFET), and the gate driver integrated device includes a two-level turn-off circuit, the two-level turn-off circuit including a voltage-current-voltage buffer to reduce the first gate voltage of the first switch from the first voltage to the second voltage, the voltage-current-voltage buffer including a first resistor including a first end and a second end, a second resistor including a third end and a fourth end, a third resistor including a fifth end and a sixth end, a second N-channel MOSFET coupled to the first end, a first P-channel MOSFET including a first gate, the first P-channel MOSFET coupled to the second end and the third end, a third N-channel MOSFET coupled to the fifth end, a second P-channel MOSFET including a second gate, the second P-channel MOSFET coupled to the sixth end, the second gate coupled to the first gate, a fourth N-channel MOSFET coupled to the fourth end, and a fifth N-channel MOSFET including a first current terminal, the first current terminal coupled to the first gate and the second gate, and a comparator circuit to turn off the first N-channel MOSFET when the second gate voltage is the fourth voltage.

Example 19 includes the power delivery system of example 15, wherein the gate driver integrated device includes a clamp circuit to turn off the first switch when the second gate voltage is the fourth voltage, the clamp circuit including an N-channel metal-oxide-semiconductor field-effect transistor (MOSFET), a buffer coupled to the N-channel MOSFET, and a low dropout regulator coupled to the buffer, the low dropout regulator to turn off the first switch by causing the buffer to turn on the N-channel MOSFET.

Example 20 includes the power delivery system of example 15, wherein the gate driver integrated device includes an output low driver to turn off the first switch when the second gate voltage is the fourth voltage, the output low driver including a first N-channel metal-oxide-semiconductor field-effect transistor (MOSFET), a second N-channel MOSFET, and an output low pre-driver circuit coupled to the first N-channel MOSFET and the second N-channel MOSFET, the output low pre-driver circuit to turn off the first switch by turning on at least one of the first N-channel MOSFET or the second N-channel MOSFET.

Although certain example methods, apparatus, and articles of manufacture have been disclosed herein, the scope of coverage of this patent is not limited thereto. On the contrary, this patent covers all methods, apparatus, and articles of manufacture fairly falling within the scope of the claims of this patent.

What is claimed is:

1. A circuit comprising:
   a first driver coupled to a first terminal, the first terminal adapted to be coupled to a gate of a transistor;
   a second driver coupled to a second terminal, the second terminal adapted to be coupled to the gate of the transistor;
   a clamp circuit coupled to a third terminal, the third terminal adapted to be coupled to the gate of the transistor; and
   a two-level turn-off circuit coupled to the first driver, to the second driver, and to the clamp circuit.

2. The circuit of claim 1, wherein the first driver is an output high driver and the second driver is an output low driver.

3. The circuit of claim 1, wherein the second driver is configured to adjust a voltage of a current terminal from a first voltage to a second voltage, responsive to receiving a signal.

4. The circuit of claim 3, wherein the first driver is configured to set the voltage of the gate to the first voltage.

5. The circuit of claim 3, wherein the clamp circuit is configured to adjust the voltage of the current terminal from the second voltage to a third voltage, wherein the third voltage is between the first voltage and the second voltage.

6. The circuit of claim 1, further comprising an over-current protection circuit coupled to a fourth terminal, wherein the fourth terminal is adapted to be coupled to a sense terminal of the transistor, and wherein the over-current protection circuit is configured to produce an over-current signal responsive to whether an over-current condition is detected in the transistor.

7. The circuit of claim 6, further comprising:
   a fault encode circuit coupled to the over-current protection circuit, the fault encode circuit configured to encode the over-current condition, to produce an encoded signal;
   a modulator coupled to the fault encode circuit, the modulator configured to modulate the encoded signal, to produce a modulated fault signal;
   a demodulator coupled to the modulator, the demodulator configured to demodulate the modulated fault signal, to produce a demodulated fault signal; and
   a fault decode circuit coupled to the demodulator, the fault decode circuit configured to produce a fault signal and a seventh terminal, the seventh terminal adapted to be coupled to a controller.

8. The circuit of claim 7, wherein the first driver, the second driver, the clamp circuit, the two-level turn-off circuit, the over-current protection circuit, the fault encode circuit, and the modulator are on a first die, and the demodulator and the fault decode circuit are on a second die.

9. The circuit of claim 1, further comprising:
   a pulse-width modulation circuit coupled to a fifth terminal and to a sixth terminal, wherein the fifth terminal and the sixth terminal are adapted to be coupled to a controller, wherein the pulse-width modulation circuit is configured to generate a pulse-width modulation signal responsive to a first signal received from the fifth terminal and a second signal received from the sixth terminal;
   a modulator circuit coupled to the pulse-width modulation circuit, the modulator circuit configured to modulated the pulse-width modulation signal, to produce a modulated signal; and
   a demodulator circuit coupled to the modulator circuit, the demodulator circuit configured to demodulate the modulated signal, to produce a demodulated signal, wherein the demodulator circuit is configured to output the demodulated signal to the first driver, the second driver, the clamp circuit, or the two-level turn-off circuit.

10. A circuit comprising:
    a first driver coupled to a first terminal;
    a second driver coupled to a second terminal; and
    a two-level turn-off circuit coupled to the first driver and to the second driver, the two-level turn-off circuit comprising:
    a voltage-current-voltage buffer;
    a transistor having a first current terminal, a second current terminal, and a control terminal, the control terminal coupled to the voltage-current-voltage buffer, the first current terminal coupled to the first driver and to the second driver; and
    a capacitor coupled between the first current terminal and the control terminal.

11. The circuit of claim 10, wherein the transistor is a first transistor and the control terminal is a first control terminal, the two-level turn-off circuit further comprising:
    a second transistor having a third current terminal, a fourth current terminal, and a second control terminal, the third current terminal coupled to the voltage-current-voltage buffer; and
    a comparator coupled to the second control terminal.

12. The circuit of claim 11, the two-level turn-off circuit further comprising:
    a current reference coupled to the comparator;
    a first unity gain buffer having a first input terminal, a second input terminal, and a first output terminal, the first output terminal coupled to the voltage-current-voltage buffer and the second input terminal coupled to the first output terminal; and
    a second unity gain buffer having a third input terminal, a fourth input terminal, and a second output terminal, the third input terminal coupled to the second output terminal and to the current reference, the third input terminal coupled to the second output terminal, and the fourth input terminal coupled to the first driver.

13. The circuit of claim 10, further comprising a clamp circuit coupled to a third terminal.

14. The circuit of claim 13, wherein the transistor is a first transistor and the first terminal, the second terminal, and the third terminal are adapted to be coupled to a gate of a second transistor.

15. The circuit of claim 10, wherein the first driver is an output high driver and the second driver is an output low driver.

16. A circuit comprising:
a first driver coupled to a first terminal;
a second driver coupled to a second terminal; and
a two-level turn-off circuit coupled to the first driver and to the second driver, the two-level turn-off circuit comprising a voltage-current-voltage buffer coupled to the first driver and to the second driver, the voltage-current-voltage buffer comprising:
  a first transistor having a first control terminal, a first current terminal, and a second current terminal;
  a second transistor having a second control terminal, a third current terminal, and a fourth current terminal, the third current terminal coupled to the second current terminal;
  a third transistor having a third control terminal, a fifth current terminal, and a sixth current terminal, the fifth current terminal coupled to the first current terminal; and
  a fourth transistor having a fourth control terminal, a seventh current terminal, and an eighth current terminal, the seventh current terminal coupled to the sixth current terminal, the fourth control terminal coupled to the eighth current terminal, and the eighth current terminal coupled to the second control terminal.

17. The circuit of claim 16, the voltage-current-voltage buffer further comprising:
a first resistor coupled between the second current terminal and the third current terminal; and
a second resistor coupled between the sixth current terminal and the seventh current terminal.

18. The circuit of claim 16, the voltage-current-voltage buffer further comprising:
a fifth transistor having a fifth control terminal, a ninth current terminal, and a tenth current terminal, the fifth control terminal coupled to the ninth current terminal, and the tenth current terminal coupled to a ground terminal; and
a resistor couple between the ninth current terminal and the fourth current terminal.

19. The circuit of claim 16, the voltage-current-voltage buffer further comprising a sixth transistor having a sixth control terminal, an eleventh current terminal, and a twelfth current terminal, the eleventh current terminal coupled to the eighth current terminal, the twelfth current terminal coupled to a ground terminal, and the sixth control terminal configured to receive a reference voltage.

20. The circuit of claim 16, the two-level turn-on circuit further comprising:
a seventh transistor having a seventh control terminal, a thirteenth current terminal, and a fourteenth current terminal, the thirteenth current terminal coupled to the first control terminal, the fourteenth current terminal coupled to a ground terminal, and the seventh control terminal coupled to the fourth current terminal; and
a capacitor coupled between the thirteenth current terminal and the seventh control terminal.

* * * * *